(12) United States Patent
Gupta

(10) Patent No.: US 12,396,250 B2
(45) Date of Patent: Aug. 19, 2025

(54) VERTICAL IGBT WITH COMPLEMENTARY CHANNEL FOR HOLE EXTRACTION

(71) Applicant: Hitachi Energy Ltd, Zürich (CH)

(72) Inventor: Gaurav Gupta, Lenzburg (CH)

(73) Assignee: HITACHI ENERGY LTD, Zurich (CH)

( * ) Notice: Subject to any disclaimer, the term of this patent is extended or adjusted under 35 U.S.C. 154(b) by 0 days.

(21) Appl. No.: 18/872,218

(22) PCT Filed: Jun. 15, 2022

(86) PCT No.: PCT/EP2022/066367
§ 371 (c)(1),
(2) Date: Dec. 5, 2024

(87) PCT Pub. No.: WO2023/241794
PCT Pub. Date: Dec. 21, 2023

(65) Prior Publication Data
US 2025/0169165 A1 May 22, 2025

(51) Int. Cl.
*H10D 84/01* (2025.01)
*H10D 64/00* (2025.01)
*H10D 84/82* (2025.01)

(52) U.S. Cl.
CPC .......... *H10D 84/82* (2025.01); *H10D 64/117* (2025.01); *H10D 84/0123* (2025.01)

(58) Field of Classification Search
CPC .......... H10D 84/0123; H10D 84/0126; H10D 12/038; H10D 12/031; H10D 12/032;
(Continued)

(56) References Cited

U.S. PATENT DOCUMENTS

2009/0008674 A1 1/2009 Udrea
2013/0026537 A1 1/2013 Rahimo et al.
(Continued)

FOREIGN PATENT DOCUMENTS

CN 113964180 A 1/2022
JP 2008-053378 A 3/2008
(Continued)

OTHER PUBLICATIONS

Jun Huang et al., "Simulation Study of a Low on-State Voltage Superjunction IGBT With Self-Biased PMOS," IEEE Transactions on Electron Devices, vol. 66, No. 7, Jul. 2019, 5 pages.
(Continued)

*Primary Examiner* — Thanhha S Pham
(74) *Attorney, Agent, or Firm* — Procopio, Cory, Hargreaves & Savitch LLP

(57) ABSTRACT

The semiconductor device comprises a semiconductor body with a top side, a main electrode on the top side and a gate electrode. The semiconductor body comprises a drift layer of a first conductivity type, a first base region of a second conductivity type, a second base region of the first conductivity type, a first contact region of the first conductivity type and a second contact region of the second conductivity type. The second base region has a greater doping concentration than the drift layer. The first contact region adjoins the first base region and the top side. The second contact region adjoins the second base region and the top side. The main electrode is in electrical contact with the first and the second contact region. In a first lateral direction, at least a portion of the gate electrode is arranged between the first contact region and the second contact region.

14 Claims, 16 Drawing Sheets

Figure 1:
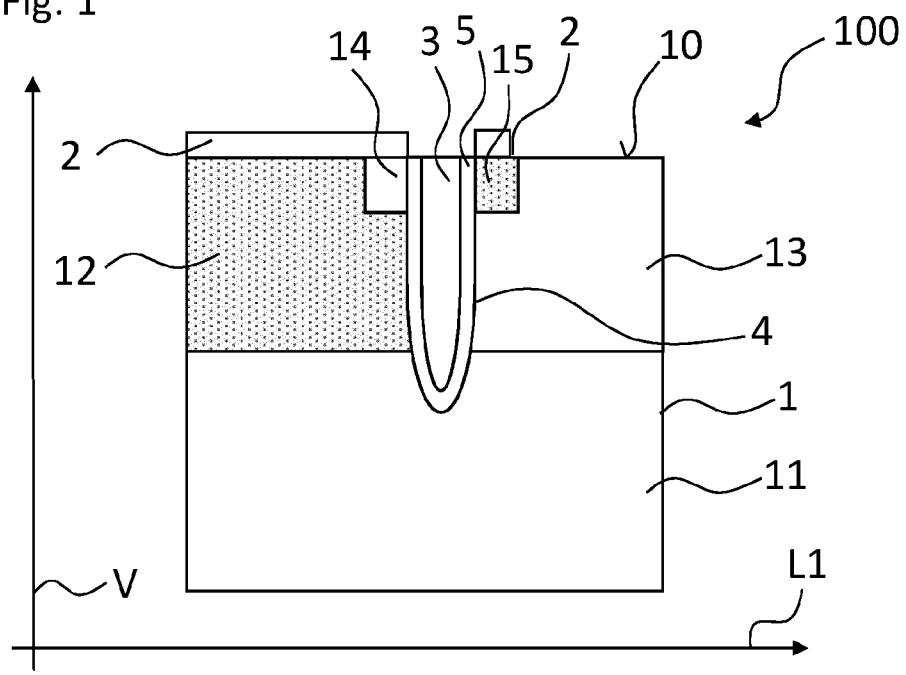

(58) Field of Classification Search
CPC .. H10D 12/411; H10D 12/417; H10D 12/418; H10D 12/421; H10D 12/441; H10D 62/177; H10D 12/415; H10D 12/416; H10D 12/461; H10D 62/184; H10D 62/393

See application file for complete search history.

(56) References Cited

U.S. PATENT DOCUMENTS

| | | | |
|---|---|---|---|
| 2018/0226398 A1 | 8/2018 | Ogura et al. | |
| 2019/0148532 A1 | 5/2019 | Naito | |
| 2019/0312101 A1* | 10/2019 | Sakurai | H10D 62/393 |

FOREIGN PATENT DOCUMENTS

| | | |
|---|---|---|
| JP | 2009188290 A | 8/2009 |
| JP | 2018125486 A | 8/2018 |

OTHER PUBLICATIONS

Jie Wei et al., "Low Switching Loss and EMI Noise IGBT With Self-Adaptive Hole-Extracting Path", IEEE Transactions on Electron Devices, vol. 68, No. 5, May 2021, 5 pages.

N. Luther-King et al., "Performance of a trench PMOS gated, planar, 1.2 kV Clustered Insulated Gate Bipolar Transistor in NPT technology," 2009 IEEE, 4 pages.

European Patent Office, International Preliminary Report On Patentability received in PCT/EP2022/066367, mailed May 16, 2024, 16 pages.

European Patent Office, International Search Report and Written Opinion of the International Searching Authority received in PCT/EP2022/066367, mailed Jan. 24, 2023, 19 pages.

* cited by examiner

VERTICAL IGBT WITH COMPLEMENTARY CHANNEL FOR HOLE EXTRACTION

The present application is a national stage entry of International Patent Application No. PCT/EP2022/066367, filed on Jun. 15, 2022, the disclosures of which are hereby incorporated herein by reference as if set forth in full.

The present disclosure relates to a semiconductor device and to a method for producing a semiconductor device.

There is a need for an improved semiconductor device, for example for a semiconductor device which enables an efficient removal of charge carriers, like holes, from the semiconductor body during turn-off transient without compromising on-state losses. Furthermore, there is a need for an improved method for producing such a semiconductor device.

Embodiments of the disclosure relate to an improved semiconductor device and an improved method for producing a semiconductor device.

Firstly, the semiconductor device is specified.

According to an embodiment, the semiconductor device comprises a semiconductor body with a top side, a main electrode on the top side and a gate electrode. The semiconductor body comprises a drift layer of a first conductivity type. The semiconductor body further comprises a first base region being of a second conductivity type arranged vertically between the drift layer and the top side.

Moreover, the semiconductor body comprises a second base region being of the first conductivity type arranged vertically between the drift layer and the top side. The second base region has a greater doping concentration than the drift layer and adjoins the drift layer. Furthermore, the semiconductor body comprises a first contact region being of the first conductivity type. The first contact region adjoins the first base region and the top side. Additionally, the semiconductor body comprises a second contact region being of the second conductivity type. The second contact region adjoins the second base region and the top side. The main electrode is in electrical contact with the first contact region and the second contact region. In a first lateral direction, at least a portion of the gate electrode is arranged between the first contact region and the second contact region as well as between the first base region and the second base region.

Bipolar semiconductor devices, like IGBTs, are devices where both electrons and holes take part in the conduction process. Injection of both electrons and holes leads to the formation of a high density plasma in the drift layer which lowers the resistance of this layer and consequently reduces losses during the on-state. However, during the off-state, the stored plasma needs to be swiftly removed in order to minimize the switching losses. Thus, there is a trade-off between on-state voltage drop (Vce-sat) and turn-off switching loses (Eoff) of such a device.

In the present invention, a complementary transistor for controlled extraction of second-type charge carriers, like holes, is introduced by means of the second base region and the second contact region. The complementary transistor provides an additional extraction path for second-type charge carriers which remains active only during the turn-off period of the main transistor comprising the first base region and the first contact region. Thus, switching-losses of the semiconductor device are reduced without compromising its on-state. The functioning of the semiconductor device is not limited by, for example, trench spacing. Moreover, since no additional gate-connection is required, the Miller capacitance, Cgc, is not adversely affected. The concept is, for example, applicable to MOS-based bipolar devices such as IGBT, reverse-conducting (RC)-IGBT, bi-directional IGBT (BIGT), MOS-controlled diode and can be translated to both trench as well as planar architecture.

The semiconductor body may be based on Si or SiC or GaN or any other semiconductor material. Lateral directions are herein defined as directions parallel to the top side of the semiconductor body. A vertical direction is herein defined as a direction perpendicular to the top side.

The main electrode may be formed of metal. The gate electrode may comprise or consist of metal or polysilicon which is highly doped. The gate electrode is, in particular, isolated from the semiconductor body by an electrically isolating material like $SiO_2$ or any other dielectric material or combination of two or more dielectric materials. Thus, the semiconductor device may be an isolated gate device. Particularly, the gate electrode and the main electrode are electrically isolated from each other so that they can be set to different electrical potentials for operation.

The drift layer may extend over the whole lateral extension of the semiconductor body. The drift layer is of the first conductivity type. The first conductivity type can be either electron conduction or hole conduction. The second conductivity type is different from the first conductivity type, i.e. is either hole conduction or electron conduction.

A region or layer being of electron conduction is n-doped and a region or layer being of hole conduction is p-doped. For example, the doping concentration in the drift layer is at least $10^8$ cm$^{-3}$ and at most $10^{15}$ cm$^{-3}$.

The first base region is arranged vertically between the drift layer and the top side, i.e. is arranged between the drift layer and the top side in vertical direction. For example, the doping concentration in the first base region is at least $10^{15}$ cm$^{-3}$ and/or at most $10^{18}$ cm$^{-3}$. The first base region may adjoin the drift layer and/or the top side, i.e. may be in direct contact with the drift layer and/or may form part of the top side.

The second base region is of the same conductivity type as the drift layer but has a greater doping concentration than the drift layer, e.g. the doping concentration in the second base region is at least 10 times or at least 100 times greater than in the drift layer. For example, the doping concentration in the second base region is at least $10^{15}$ cm$^{-3}$ and/or at most $10^{18}$ cm$^{-3}$.

The second base region adjoins the drift layer, i.e. is in direct contact with the drift layer. Particularly, there is no region of the second conductivity type arranged vertically between the drift layer and the second base region. Furthermore, the second base region may adjoin the top side, i.e. may form part thereof.

Herein, when comparing doping concentrations of layers or regions, the average doping concentrations or maximum doping concentrations of these layers or regions are compared. When defining upper and lower limits of the doping concentration in a layer or region, it is meant that the maximum doping concentration in the respective layer/region does not exceed the upper limit and the minimum doping concentration in the respective layer/region does not fall below the lower limit.

The first contact region adjoins the first base region and the top side, i.e. is in direct contact with the first base region and forms part of the top side. For example, the first contact region is arranged vertically between the first base region and the top side and adjoins the first base region in vertical direction. Additionally or alternatively, the first contact region may adjoin the first base region in the first lateral direction.

The first contact region may be at least partially embedded in the first base region. Particularly, the first contact region may be at least partially laterally surrounded by the first base region. The doping concentration in the first contact region is, for example, greater than in the first base region, for example at least 10 times or at least 100 times greater. For example, the doping concentration in the first contact region is at least $10^{17}$ cm$^{-3}$ or at least $10^{18}$ cm$^{-3}$ or at least $10^{19}$ cm$^{-3}$.

The second contact region adjoins the second base region and the top side, i.e. is in direct contact with the second base region and forms part of the top side. For example, the second contact region is arranged vertically between the second base region and the top side and adjoins the second base region in vertical direction. Additionally or alternatively, the second contact region may adjoin the second base region in the first lateral direction.

The second contact region may be at least partially embedded in the second base region. Particularly, the second contact region may be at least partially laterally surrounded by the second base region. The doping concentration in the second contact region is, for example, greater than in the second base region, for example at least 10 times or at least 100 times greater. For example, the doping concentration in the second contact region is at least $10^{17}$ cm$^{-3}$ or at least $10^{18}$ cm$^{-3}$ or at least $10^{19}$ cm$^{-3}$.

The contact regions are also known as source regions.

The thickness of the first and the second base region, measured in vertical direction, may be at least 1 μm and/or at most 8 μm. The thickness of the first and the second contact region may, in each case, be at least 50 nm and/or at most 1 μm. The lateral extension of the first and the second contact region in the first lateral direction may, in each case, be at least 50 nm and/or at most 5 μm. The lateral extension in the first lateral direction of the first and the second base region may, in each case, be at least 500 nm and/or at most 5 μm.

The main electrode is in electrical contact, i.e. direct electrical contact, with the first and the second contact region. For example, the main electrode adjoins the first and the second contact region at the top side. For example, the main electrode is not in direct electrical contact with the second base region. An ohmic contact may be formed between the main electrode and the contact regions.

In the first lateral direction, at least a portion of the gate electrode, e.g. a major portion of the gate electrode or the whole gate electrode, is arranged laterally between the first and the second contact region as well as between the first and the second base region. For example, only one gate electrode is arranged between the first and the second contact region as well as between the first and the second base region in the first lateral direction. By way of example, the distance between the first and the second contact region measured in the first lateral direction is at most twice or at most 1.5 times as large as the lateral extension of the gate electrode in the first lateral direction. For example, the distance in the first lateral direction between the first and the second contact region is at most 10 μm.

According to a further embodiment, the semiconductor device is configured such that, by setting the electrical potential of the gate electrode, either a zone of the first base region is inverted, i.e. the conduction type is inverted in this zone, by means of the gate electrode and thus a current flow of first-type charge carriers between the drift layer and the first contact region through this zone is enabled. The inverted zone faces the gate electrode, i.e. is a zone of the first base region closest to the gate electrode.

Alternatively, a zone of the second base region is at inverted by means of the gate electrode and thus a current flow of second-type charge carriers between the drift layer and the second contact region through this zone is enabled. Also here, the inverted zone faces the gate electrode, i.e. is a zone of the second base region closest to the gate electrode.

Thus, the drift layer, the first base region and the first contact region form part of a first transistor (main transistor) and the drift layer, the second base region and the second contact region form part of a second transistor (complementary transistor).

In the case of the first conductivity type being electron conduction, the first-type charge carriers are electrons. Accordingly, the second conductivity type is then hole conduction and the second-type charge carriers are holes.

For example, in the first case, when a zone of the first base region is inverted, the flow of first-type charge carriers from the main electrode through the first contact region, the inverted zone of the first base region and into the drift layer is enabled. For example, in the second case, when a zone of the second base region is inverted, a flow of second-type charge carriers from the drift layer through the inverted zone of the second base region and the second contact region into the main electrode is enabled.

According to a further embodiment, the semiconductor device is a planar device, i.e. of planar architecture, with the gate electrode arranged on the top side. For example, in the first lateral direction, the gate electrode is at least partially aligned with the first and the second contact region and/or with the first and the second base region. The gate electrode is thereby isolated from the contact regions by the electrically isolating layer. For example, in plan view onto the top side, the gate electrode at least partially overlaps with the first and the second contact region and with the first and the second base region.

According to a further embodiment, the semiconductor device is a trench device, i.e. of trench architecture, with the gate electrode being arranged in an active trench. The active trench extends from the top side in vertical direction into the semiconductor body. For example, the first and the second contact regions and/or the first and the second base regions are at least partially aligned with the gate electrode in vertical direction. That is, in a side view along the first lateral direction, the active trench and the gate electrode therein partially or completely overlap the first and the second contact regions and/or the first and the second base region. For example, the active trench extends deeper into the semiconductor body than the first and the second contact regions and/or than the first and the second base region. For instance, the active trench and the gate electrodes extend into the semiconductor body in vertical direction by at least 2 μm or at least 4 μm and/or by at most 10 μm.

According to a further embodiment, the semiconductor device comprises a dummy trench arranged next to the active trench and spaced form the active trench in the first lateral direction.

A trench with a gate electrode therein is herein called "active trench". Trenches without a gate electrode therein are herein called "dummy trenches". For example, the second base region and the second contact region are arranged between the active trench and the dummy trench in the first lateral direction. The second base region may adjoin the active trench and the dummy trench in the first lateral direction.

According to a further embodiment, the dummy trench is filled with an electrically conductive material, like highly doped polysilicon. The electrically conductive material is, for example, electrically isolated form the semiconductor body by isolating material. For instance, the electrically conductive material in the dummy trench is electrically connected to the main electrode.

The trenches of the semiconductor device, independently of whether they are active or dummy trenches, may all have the same dimensions within the limits of the manufacturing tolerances. Alternatively, the dummy trenches may be deeper or less deep than the active trenches.

For example, exactly one active trench is arranged between the first and the second contact region as well as between the first and the second base region. The first and the second contact region may adjoin the active trench on different sides with respect to the first lateral direction.

Likewise the first and second base region may adjoin the active trench on different sides with respect to the first lateral direction.

According to a further embodiment, an enhancement region of the first conductivity type is arranged vertically between the first base region and the drift layer. For example, the enhancement region laterally extends over the whole lateral extension of the first base region. Thus, the enhancement layer is arranged between the drift layer and the first base region over the whole lateral extension of the first base region. The enhancement region may adjoin the first base region and/or the drift layer. This enhancement region is herein also called "first enhancement region".

According to a further embodiment, the enhancement region has a greater doping concentration than the drift layer. For example, the doping concentration in the first enhancement region is at least 10 times or at least 100 times greater than in the drift layer. For example, the doping concentration in the enhancement region is at least $10^{15}$ cm$^{-3}$ and/or at most $10^{19}$ cm$^{-3}$. The thickness of the enhancement region, measured in vertical direction, is, for example, at least 1 µm and/or at most 3 µm.

The enhancement region is a blocking region for the second-type charge carriers which are, for example, holes. It may therefore be called "hole blocking region" or "hole blocking layer", respectively.

According to a further embodiment, the semiconductor device comprises a third base region being of the second conductivity type. The third base region is arranged next to the second base region in the first lateral direction so that the second base region is arranged between the first and the third base region in the first lateral direction. The second and the third base region may be spaced from each other in the first lateral direction by a trench, for example by exactly one trench. This trench may be an active trench or a dummy trench.

The third base region is also arranged vertically between the top side and the drift layer. It may adjoin the top side and/or the drift layer. The doping concentration in the third base region may be in the same or different range as the doping concentration in the first base region. The thickness of the third base region, measured in vertical direction, is, for example, larger than that of the first base region, e.g. by at least 1 µm.

According to a further embodiment, the third base region extends from the top side into the semiconductor body. For example, the third base region extends deeper into the semiconductor body than the active trench or than the trenches. For example, the third base region extends at least 1 µm deeper into the semiconductor body than the trench(es). The third base region is, for example, a so-called p-well.

According to a further embodiment, the thickness of an insulating material between the first contact region and/or the first base region and the gate electrode is greater than the thickness of the insulating material between the second contact region and/or the second base region and the gate electrode. For example, the thickness between the first contact region/first base region and the gate electrode is at least 1.5 times or at least two times greater than between the second contact region/second base region and the gate electrode.

According to a further embodiment, the main electrode is not in direct electrical contact with the second base region. This means that charge carriers cannot directly flow from the main electrode into the second base region or vice versa. Rather, charge carrier exchange always has to happen via the second contact region.

According to a further embodiment, the semiconductor device comprises a further gate electrode. The further gate electrode is spaced from the gate electrode in the first lateral direction. For example, the further gate electrode lies on the same electrical potential as the gate electrode. In other words, the gate electrode and the further gate electrode may be short circuited.

Also the further gate electrode may be arranged in an active trench extending from the top side into the semiconductor body.

According to a further embodiment, the second base region is arranged between the gate electrode and the further gate electrode in the first lateral direction. For example, no further gate electrodes are arranged between the gate electrode and the further gate electrode in the first lateral direction. The second base region may adjoin the two active trenches comprising the gate electrode and the further gate electrode in the first lateral direction.

According to a further embodiment, the semiconductor device is configured such that, by setting the electrical potential of the further gate electrode, a zone of the second base region is inverted by means of the further gate electrode, said zone being located at a side of the second base region opposite to the side of the second base region at which the zone of the second base region is inverted by means of the gate electrode. Thus, the further gate electrode provides a current path at this opposite side. "Opposite" here refers to the first lateral direction. In other words, the gate electrode and the further gate electrode invert zones of second base region which are arranged at opposite sides and which are, for example, spaced in the first lateral direction.

In other words, the gate electrode and the further gate electrode establish two channels, for example hole channels, for transport of charge carriers.

According to a further embodiment, the first and/or the second contact regions are elongated regions extending in a second lateral direction which is oblique to the first lateral direction, for example perpendicular to the first lateral direction. This means that the lateral extension of the first and/or the second contact regions is in each case larger in the second lateral direction than in the first lateral direction. For example, the lateral extension in the second lateral direction is in each case at least two times or at least five times larger than in the first lateral direction. The first and the second contact region may adjoin the top side over the whole lateral extension in the first and/or the second lateral direction.

Likewise the first and the second base regions may be elongated and extend in the second lateral direction. Also the trenches may be elongated and may extend in the second lateral direction.

According to a further embodiment, the semiconductor device comprises several first contact regions which adjoin the top side and the first base region and which are in electrical contact with the main electrode. These first contact regions are separated and spaced from each other in the second lateral direction. For example, each first contact region has a lateral extension in the second lateral direction of at least 500 nm or at least 1 µm. The distance between each two adjacent first contact regions in the second lateral direction may, in each case, be at least 500 nm or at least 1 µm. All features disclosed so far for one first contact region are also disclosed for all other first contact regions, particularly concerning doping concentration and conductivity type.

According to a further embodiment, the semiconductor device comprises several second contact regions adjoining the top side and the second base region and being in electrical contact with the main electrode. These second contact regions are separated and spaced from each other in the second lateral direction. For example, each second contact region has a lateral extension in the second lateral direction of at least 500 nm or at least 1 µm. The distance between each two adjacent second contact regions in the second lateral direction may, in each case, be at least 500 nm or at least 1 µm. All features disclosed so far for one second contact region are also disclosed for all other second contact regions, particularly concerning doping concentration and conductivity type.

According to a further embodiment, the semiconductor device is a power semiconductor device. For example, the semiconductor device is configured for processing a current of at least 1 A and/or voltages of at least 100 V. The semiconductor device is, for example, a so-called vertical semiconductor device.

According to a further embodiment, the semiconductor device is a vertical device, i.e. of vertical architecture. The cathode and anode are then arranged at opposite sides of the semiconductor body.

According to a further embodiment, the semiconductor device is a bipolar semiconductor device in which both electrons and holes contribute to the electric current during operation.

According to a further embodiment, the semiconductor device is an insulated gate bipolar transistor, IGBT for short, or a MOS-controlled diode. The semiconductor device is, for example, a reverse-conducting (RC)-IGBT or a bi-directional IGBT (BIGT).

According to a further embodiment, the semiconductor device comprises a further main electrode which is applied onto a back side of the semiconductor body, which is opposite to the top side. The semiconductor body may comprise a contact layer (anode layer) and/or a buffer layer between the drift layer and the further main electrode.

Next, the method for producing a semiconductor device is specified. The method is, in particular, suited for producing a semiconductor device according to any one of the embodiments described herein. Therefore, all features disclosed for the semiconductor device are also disclosed for the method and vice versa.

According to an embodiment of the method for producing a semiconductor device, the method comprises a step of providing a semiconductor body with a top side and a drift layer of a first conductivity type. In further steps, a first base region, a second base region, a first contact region and a second contact region are produced. The first base region is of a second conductivity type and is produced such that the first base region lies vertically between the drift layer and the top side. The second base region is of the first conductivity type and is produced such that the second base region lies vertically between the drift layer and the top side, wherein the second base region has a greater doping concentration than the drift layer and adjoins the drift layer. The first contact region is of the first conductivity type and is produced such that the first contact region adjoins the first base region and the top side. The second contact region is of the second conductivity type and is produced such that the second contact region adjoins the second base region as well as the top side. In a further step, a main electrode is applied onto the top side and an electrical contact between the main electrode and the first contact region as well as between the main electrode and the second contact region is established. In a further step, a gate electrode is formed so that, in the end, at least a portion of the gate electrode lies between the first contact region and the second contact region as well as between the first base region and the second base region in a first lateral direction.

Before forming the first and second base region as well as the first and the second contact region, the drift layer may reach the top side, e.g. forms the top side. Producing the base regions and/or the contact regions may comprise the implantation of dopants, e.g. through the top side. For example, masks are used for defining the areas where the dopants for the different regions shall be implanted.

Hereinafter, the semiconductor device and the method for producing a semiconductor will be explained in more detail with reference to the drawings on the basis of exemplary embodiments. The accompanying figures are included to provide a further understanding. In the figures, elements of the same structure and/or functionality may be referenced by the same reference signs. It is to be understood that the embodiments shown in the figures are illustrative representations and are not necessarily drawn to scale. In so far as elements or components correspond to one another in terms of their function in different figures, the description thereof is not repeated for each of the following figures. For the sake of clarity, elements might not appear with corresponding reference symbols in all figures.

Figure 5:
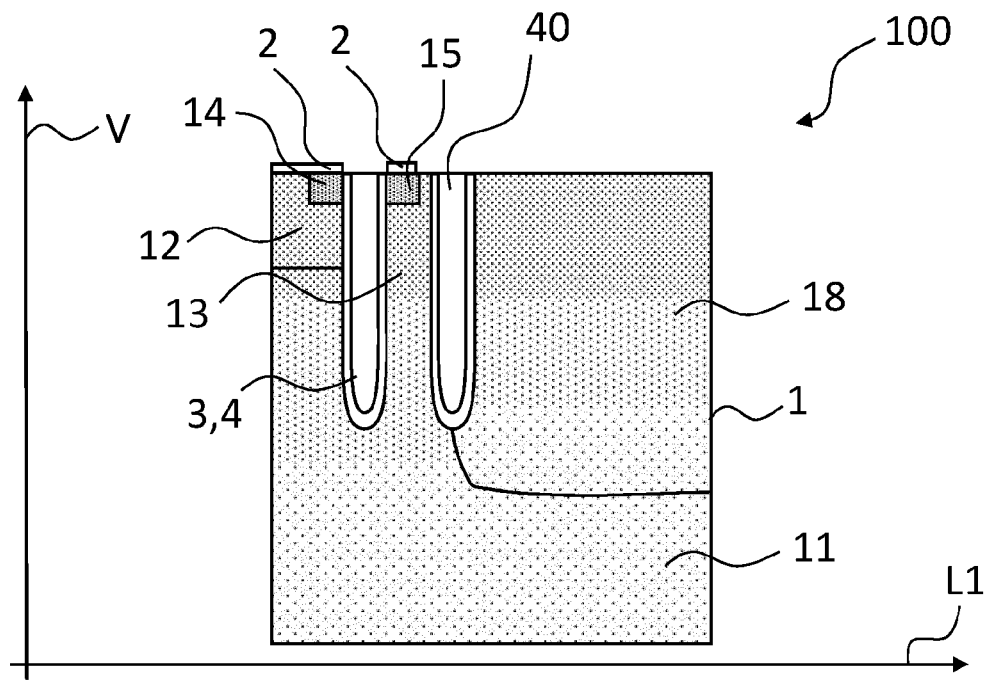
Figure 6:
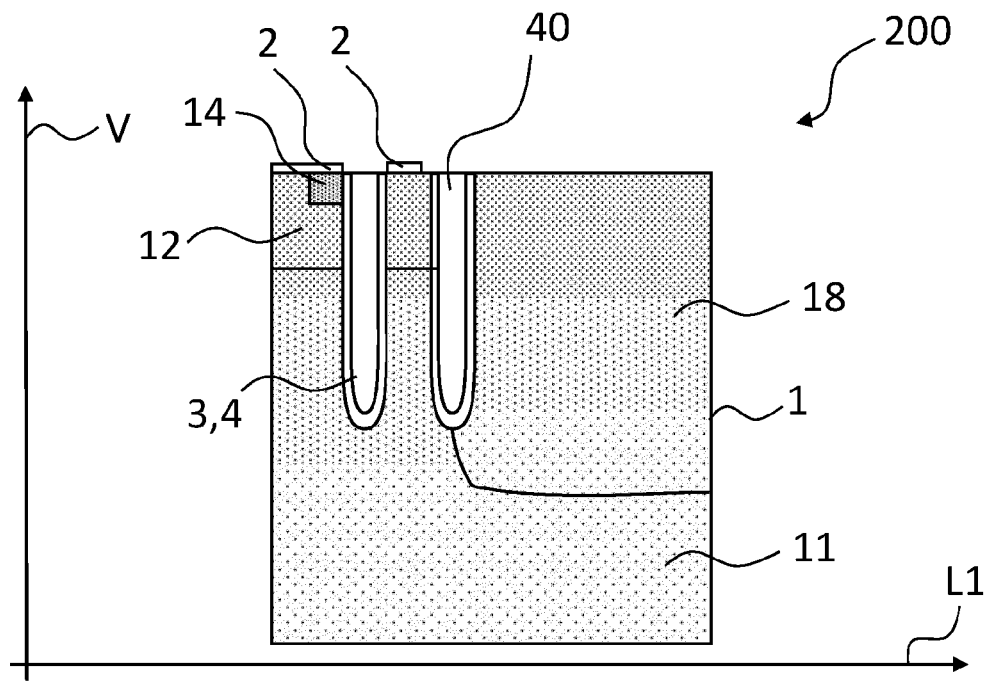
Figure 9:
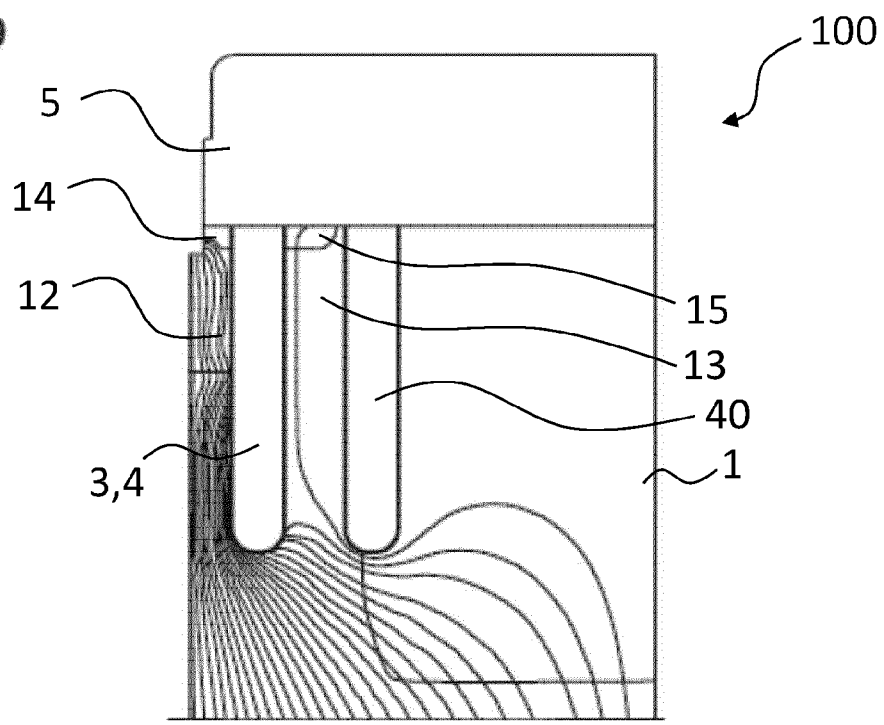
Figure 10:
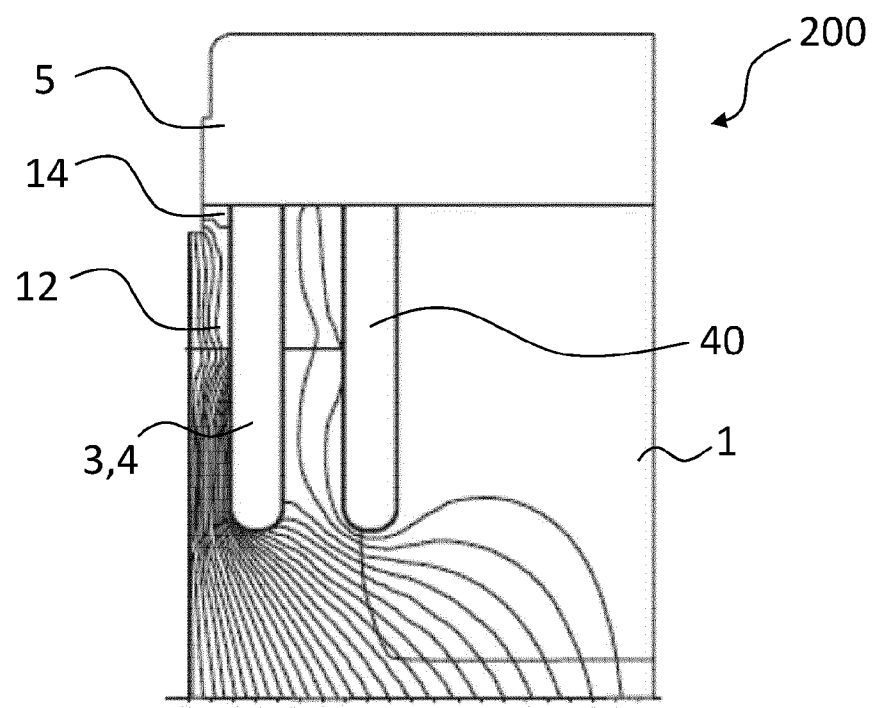
Figure 16:
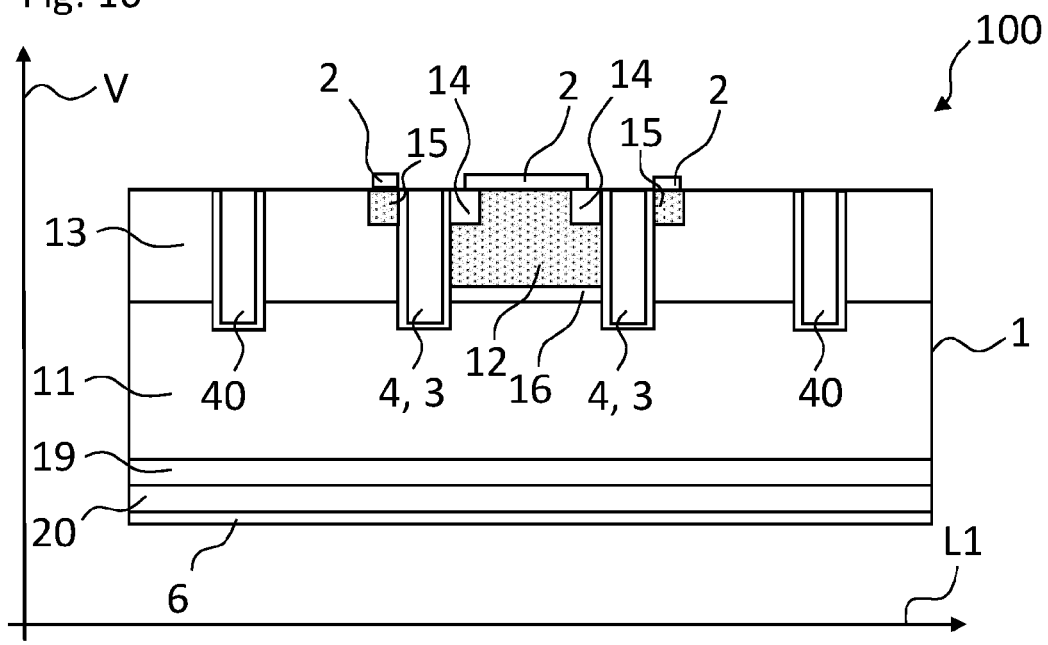
Figure 17:
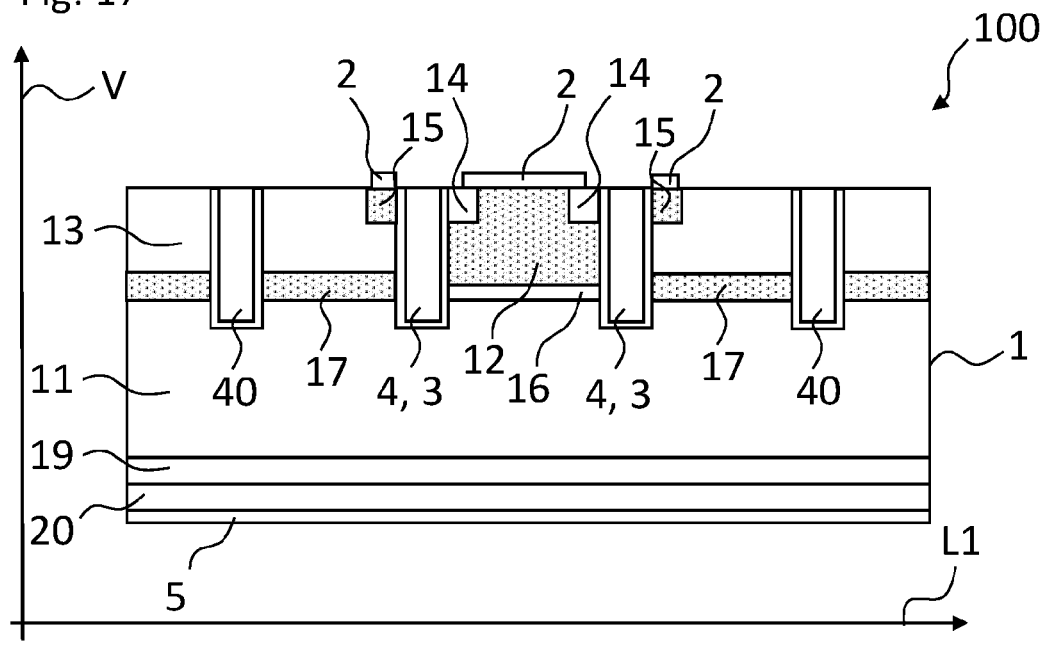
Figure 29:
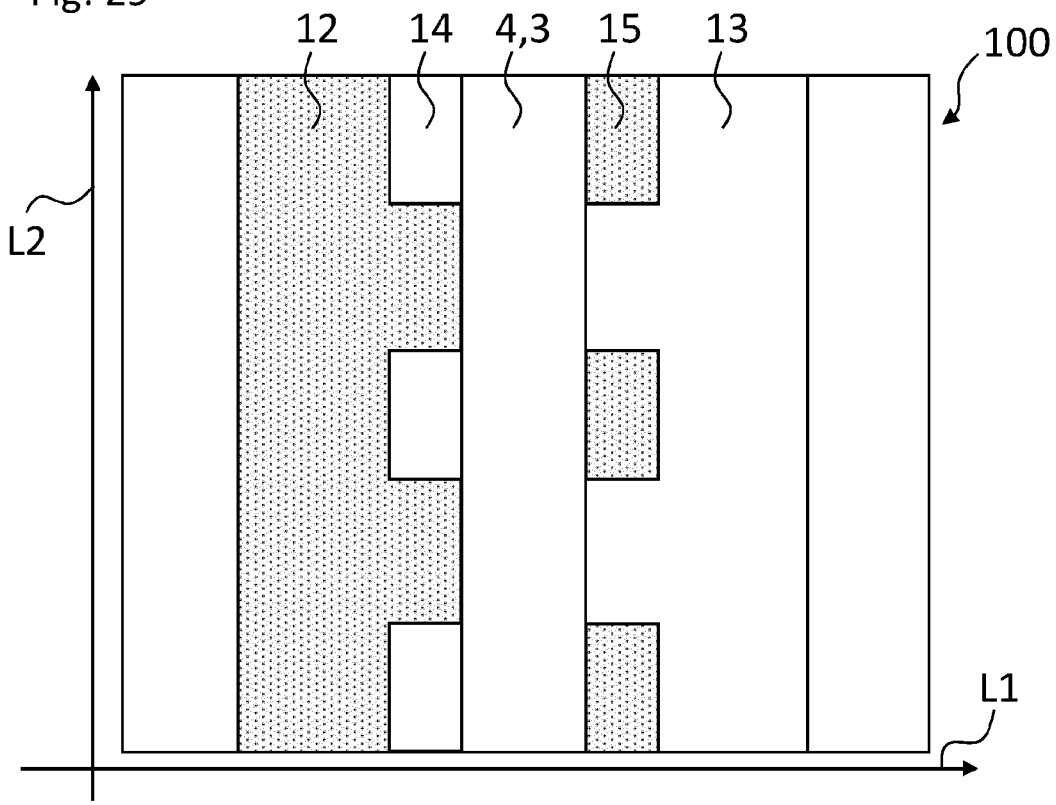
Figure 30:
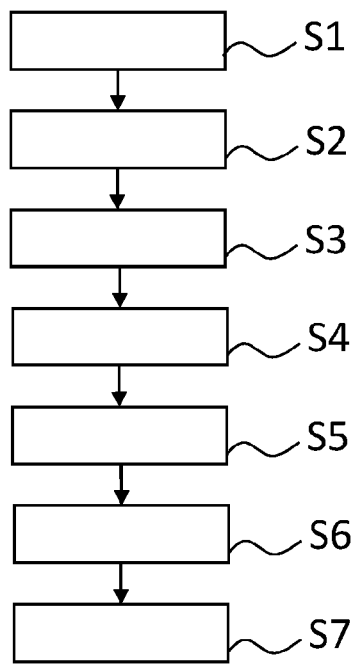

FIGS. 1 to 5, 9, 16, 18 to 29 and 31 show different exemplary embodiments of the semiconductor device in different views, FIGS. 6 and 10 show a reference semiconductor device, FIGS. 7, 8 and 11 to 15 show simulation results illustrating the behavior of an exemplary embodiment of the semiconductor device and a reference semiconductor device, FIG. 17 shows an example of a semiconductor device, FIG. 30 shows a flowchart of an exemplary embodiment of the method for producing a semiconductor device.

FIG. 1 shows a section of a first exemplary embodiment of the semiconductor device 100 in cross-sectional view. The semiconductor device 100 comprises a semiconductor body 1, e.g. of Si or SiC or GaN. A main electrode 2 is applied on the top side 10 of the semiconductor body 1. The main electrode 2 is, e.g., a metal electrode.

The semiconductor body 1 comprises a drift layer 11 which is of a first conductivity type. In the following, the first conductivity type is assumed to be electron conduction and the corresponding doping is an n-doping. Thus, the drift layer 11 is n-doped. However, the described embodiments would also work if the first conductivity type would be hole conduction.

A first base region 12 and a second base region 13 are each located vertically between the drift layer 11 and the top side 10. "Vertically" herein means in vertical direction V, which is a direction perpendicular to the top side 10. The first base region 12 and the second base region 13 are arranged next to each other in a first lateral direction L1, which is a direction parallel to the top side 10. The first base region 12 is of a second conductivity type which is different from the first conductivity type, i.e. in the present case p-doped. The second base region 13 is of the first conductivity type, i.e. n-doped. The base regions 12, 13 both adjoin the drift layer 11 and the top side 10.

A first contact region 14 is embedded in the first base region 12. The first contact region 14 is of the first conductivity type, i.e. n-doped, and adjoins the first base region 12 as well as the top side 10. At the top side 10, the first contact region 14 is in direct mechanical and electrical contact with the main electrode 2. Also the first base region 12 is in direct mechanical and electrical contact with the main electrode 2 at the top side 10.

A second contact region 15 is embedded in the second base region 13. The second contact region 15 is of the second conductivity type, i.e. p-doped, and adjoins the second base region 13 as well as the top side 10. At the top side 10, the second contact region 15 is in direct mechanical and electrical contact with the main electrode 2. The main electrode 2 is, however, not in direct mechanical or electrical contact with the second base region 13 so that an exchange of charge carriers between the main electrode 2 and the second base region 13 always has to happen through the second contact region 15.

Laterally between the base regions 12, 13 and the contact regions 14, 15, an active trench 4 extends from the top side 10 into the semiconductor body 1 and opens into the drift layer 11. The depth of the active trench 4, measured in vertical direction V, is greater than the thickness of the base regions 12, 13 and the contact regions 14, 15, also measured in vertical direction V. A gate electrode 3 is arranged inside the active trench 4. The gate electrode 3 is, for example, made of highly doped polysilicon. The gate electrode 3 is electrically isolated from the semiconductor body 1, particularly from the base regions 12, 13 and the contact regions 14, 15, by an electrically isolating material 5, which is, for example, of $SiO_2$. The semiconductor device 100 of FIG. 1 is a so-called trench device.

The doping concentration of the drift layer 11 is, for example, between $10^8$ cm$^{-3}$ and $10^{15}$ cm$^{-3}$. The doping concentration of each base region 12, 13, is, for example, in the range between $10^{15}$ cm$^{-3}$ and $10^{18}$ cm$^{-3}$. The doping concentration in the contact regions 14, 15 is in each case in the range between $10^{18}$ cm$^{-3}$ and $10^{21}$ cm$^{-3}$, for example.

During the on-state of the semiconductor device 100, the gate electrode 3 may be on an electrical positive potential with respect to the semiconductor body 1. Thereby, an inverted zone is formed in the first base region 12 at the side facing the active trench 4, said inverted zone extending along the active trench 4 from the first contact region 14 to the drift layer 11. This enables electrons to be injected from the main electrode 2 into the contact region 14 and to travel from there inside the inverted zone into the drift layer 11.

In the off state of the semiconductor device 100, the gate electrode 3 may be on electrical negative potential with respect to the semiconductor body 1. The electrical potentials of the main electrode 2 and the further main electrode may be the same as in the on state. Thereby, an inverted zone is formed in the second base region 13 at the side facing the active trench 4, said inverted zone extending along the active trench 4 from the second contact region 15 to the drift layer 11. This enables holes to exit out from the drift layer 11 via the inverted zone and to travel along the inverted zone, then through the second contact region 15 and into the main electrode 2.

Particularly in the case of the semiconductor device 100 being a bipolar device, like an IGBT, a very efficient hole drainage is enabled in this way, which results in reduced turn off losses.

The transistor realized with the first base region 12 and the first contact region 14 is herein called "main transistor" and the transistor realized with the second base region 13 and the second contact region 15 is herein called "complementary transistor". In the exemplary embodiments described herein, the main transistor is a NMOS transistor and the complementary transistor is a PMOS transistor.

Figure 2:
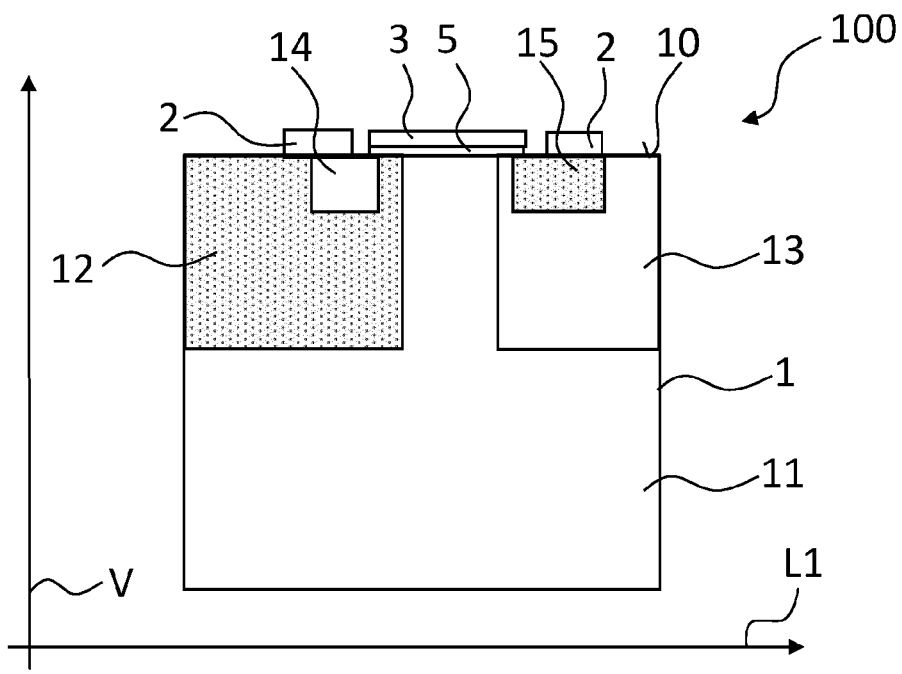

The exemplary embodiment of FIG. 2 shows a so-called planar device, which does not use a trench as shown in FIG. 1. Instead, the gate electrode 3 is arranged on the top side 10 and is electrically isolated from the semiconductor body 1 by electrically isolating material 5. In plan view onto the top side 10, the gate electrode 3 partially covers, i.e. overlaps, the first 14 and the second 15 contact region. Whereas the inverted zones and the associated current paths in FIG. 1 are orientated mainly in vertical direction V, the inverted zones and the associated current paths of FIG. 2 are orientated mainly in the first lateral direction L1.

Figure 3:
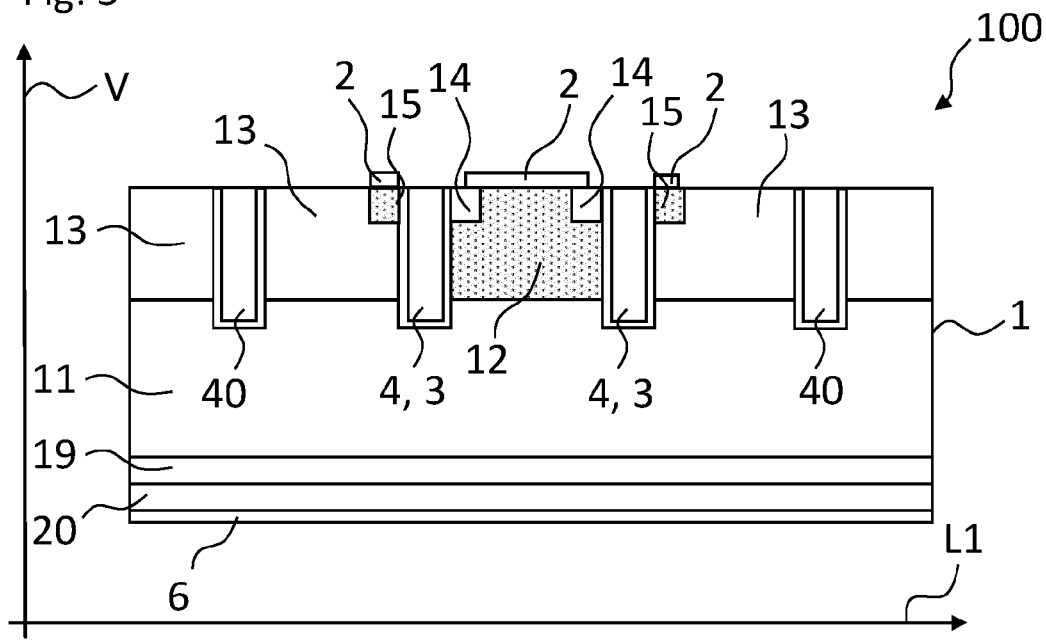

The exemplary embodiment of FIG. 3 shows a semiconductor device 100 which is an insulated gate bipolar transistor, IGBT for short. On the back side of the semiconductor body 1, opposite to the top side 10, a further main electrode 6 is applied, which is for example of metal. The semiconductor body 1 comprises a further layer 20 of the second conductivity type, i.e. p-doped, which forms the back side and which is in direct electrical and mechanical contact with the further main electrode 6. The doping concentration of the further layer 20 is, e.g., greater than in the drift layer 11. Between the drift layer 11 and the layer 20, a layer 19 being of the first conductivity is applied. The layer 19 adjoins the layer 20 and the drift layer 11. The doping concentration in the layer 19 is, for example, greater than in the drift layer 11. The layer 19 is a so-called buffer layer.

In FIG. 3, the first base region 12 adjoins active trenches 4 at both sides with respect to the first lateral direction L1. Both active trenches 4 are connected to a gate electrode 3. On both sides of the first base region 12, again with respect to the first lateral direction L1, second base regions 13 are arranged, which are each spaced from the first base region 12 by means of one of the active trenches 4.

The second base regions 13 each lie between two trenches 4, 40 and adjoin them. In both cases, only the trench closer to the first base region 12 is an active trench 4. The respective other trench 40 is a dummy trench. The dummy trenches 40 are filled with electrically conductive material which is, for example, electrically connected to the main electrode 2 and, therefore, lies on the same electrical potential as the main electrode 2. The dummy trenches 40 help to reduce the capacitance between the gate electrodes 3 and the further main electrode 6, also called Miller capacitance or gate-collector capacitance, Cgc.

FIG. 3, as well as the other figures, may only show a section of a semiconductor device. The structures shown in these figures comprising the base regions 12, 13 and the contact regions 14, 15 may be repeated several times in the first lateral direction L1.

Figure 4:
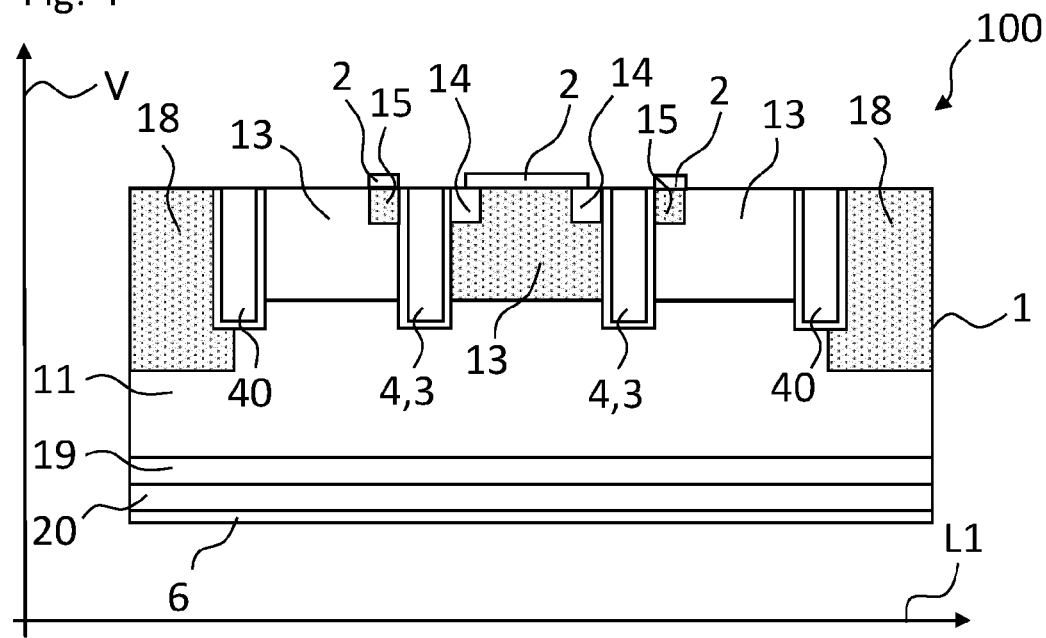

In the exemplary embodiment of FIG. 4, the semiconductor body 1 comprises third base regions 18 which are of the second conductivity type, i.e. p-doped, and which adjoin the dummy trenches 40 at the sides facing away from the second base regions 13. The doping concentration in the third base regions 18 may be the same or different as in the first base regions 12. The third base regions 18 constitute p-wells, which reach deeper into the semiconductor body 1 than the trenches 4, 40. With the third base regions 18 an improved breakdown voltage can be obtained.

FIG. 5 shows a detailed view of the exemplary embodiment of FIG. 4, where only one half of the first base region 12, the neighboring second base region 13 and the third base region 18 are shown. FIG. 5 illustrates the doping profile by using different hatchings. The higher the dotting density of the hatching, the higher the doping concentration.

FIG. 6 shows a reference semiconductor device 200, e.g. a reference IGBT. In contrast to the IGBT of FIG. 5, the second base region 13 and the second contact region 15 are dismissed. Rather, laterally between the dummy trench 40 and the active trench 4, the semiconductor body 1 adjoining the top side 10 is also made of semiconductor material of the second conductivity type, e.g. with the same doping concentration as the first base region 12. The main electrode 2 is in electrical and mechanical contact with the semiconductor body 1 in the region between the two trenches 4, 40 (dummy contact).

Figure 7:
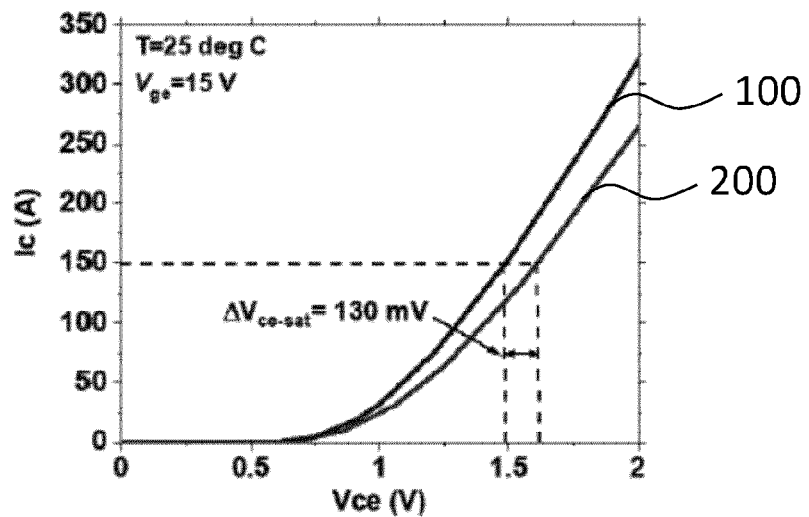
Figure 8:
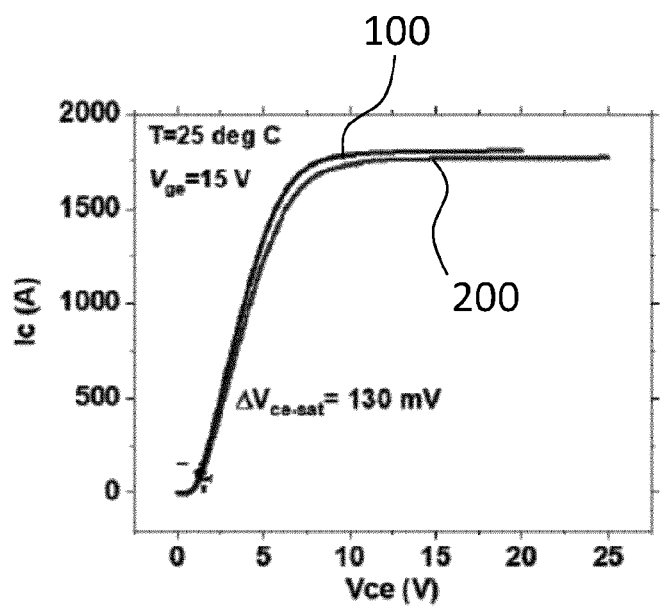

FIGS. 7 and 8 show simulations of the output characteristics Ic vs Vce of the IGBT according to FIG. 5 (curve 100) in comparison with the output characteristics of the reference IGBT according to FIG. 6 (curve 200), i.e. without the second base region and the second contact region. FIG. 7 shows the range from 0 to 2 V and FIG. 8 shows the range from 0 to 25 V. The IGBT according to FIG. 5 shows ~130 mV improvement in the Vce-sat as compared to the reference IGBT according to FIG. 6. In the reference IGBT, the extraction of injected holes between the dummy trench 40 and the active trench 4 in the on state leads to the deterioration of the plasma concentration in the drift region (drift layer 11) and therefore leads to higher on-state losses. In the IGBT of FIG. 5, this hole extraction between the dummy trench 40 and the active trench 4 in the on state is significantly suppressed (~50%, see also FIG. 9). This is a consequence of placing the second base region and the second contact region (PMOS transistor) in between the active trench 4 and the dummy trench 40. This PMOS transistor is off during the IGBT on-state (Vge>Vth) and thereby practically eliminates the hole-extraction path in said region between the active trench 4 and the dummy trench 40. This explains the superior Vce-sat of the IGBT which is quite close the Vce-sat of an IGBT without any electrical contact of the semiconductor body to the main electrode in the area of the top side laterally between the dummy trench 40 and the active trench 4 (i.e. without dummy contact).

In short, the electrical contact to the main electrode 2 in the region between the active trench 4 and the dummy trench 40 is effectively invisible during the IGBT on-state as desired for retaining the plasma concentration.

FIG. 9 shows simulated hole current flow-lines during the on state operation of the IGBT according to FIG. 5, whereas FIG. 10 shows simulated hole current flow-lines for the reference IGBT according to FIG. 6. The density of the contour lines is proportional to the hole current. In FIGS. 9 and 10, Vce is chosen to be 3 V. as can be seen, current flow of holes between the active trench 4 the dummy trench 40 is significantly suppressed for the IGBT according to FIGS. 5 and 9.

Figure 11:
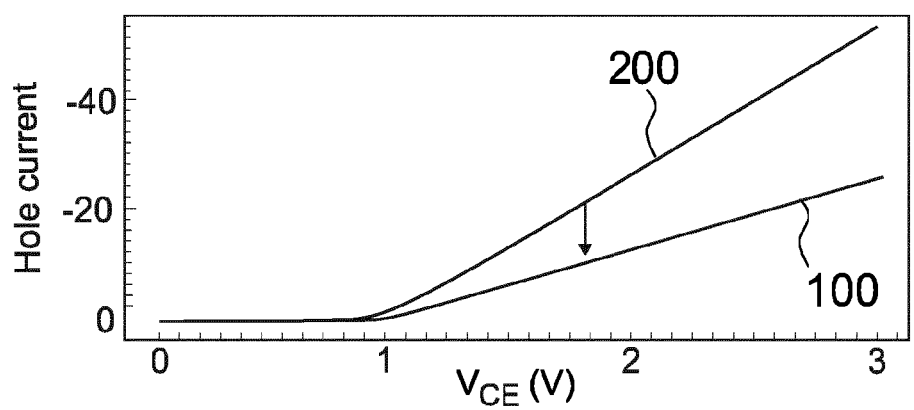

FIG. 11 shows simulated hole current at second contact region vs the voltage Vce during on-state operation for the IGBT according to FIG. 5 (curve 100) and the reference IGBT (curve 200). As can be seen, with the IGBT according to FIG. 5, a reduction of about 50% of the hole current can be achieved in the on-state.

Figure 12:
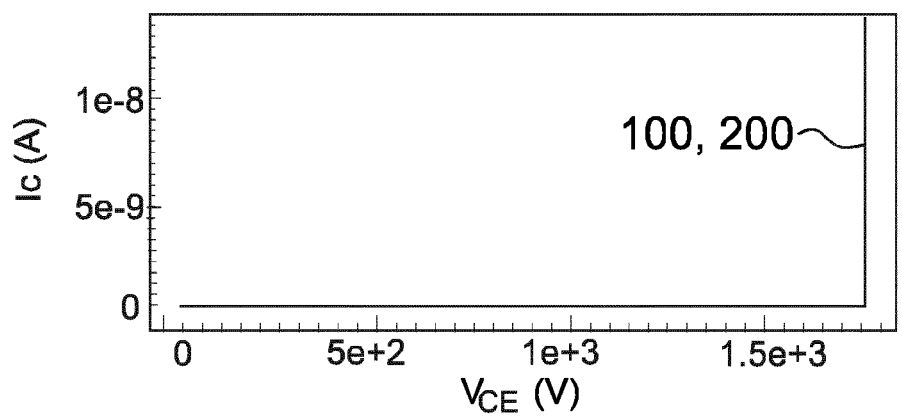

FIG. 12 shows simulations of Ic vs Vce for Vge=−15 V. As can be seen, the blocking capabilities of the IGBT according to FIG. 5 (curve 100) and of the reference IGBT according to FIG. 6 (curve 200) are almost the same.

Figure 13:
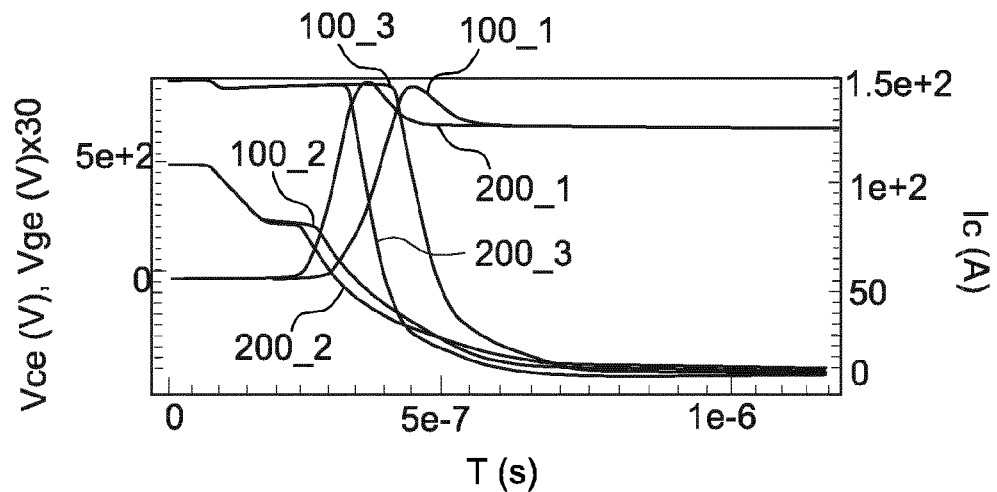

FIG. 13 shows simulations of the turn-off switching characteristics of the IGBT according to FIG. 5 (curves 100_i) and the reference IGBT according to FIG. 6 (curves 200_i). The curves 100_1, 200_1 show Vce vs time T, the curves 100_2, 200_2 show Vge vs time T and the curves 100_3, 200_3 show Ic vs time T. The turn-off switching loss, Eoff, of the IGBT according to FIG. 5 is quite close to that of the reference IGBT according to FIG. 6. Also note that Eoff of the IGBT according to FIG. 5 is lower than that of the reference IGBT without the electrical contact to the main electrode in the region between the trenches (see table below). This implies that the PMOS transistor which prevents holes from going out in the on-state is now active in IGBT off-state and is effective in extracting holes out of the IGBT device which in turn lowers its switching losses. In other words, the contact to the main electrode in the region between the dummy trench and the active trench which was effectively invisible during IGBT on-state is visible during IGBT off-state as desired for improved on-state and switching losses at the same time.

Figure 14:
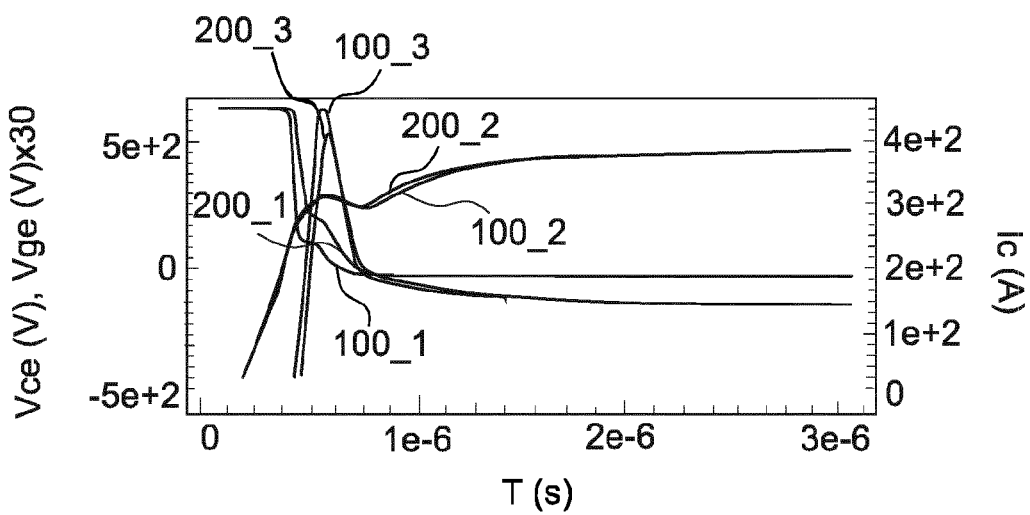

FIG. 14 shows simulations of the turn-on switching characteristics with the same nomenclature as in FIG. 13. The IGBT according to FIG. 5 shows lower turn-on losses, Eon, which are attributed to its lower gate-emitter capacitance, Cge, as compared to that of the reference IGBT of FIG. 6. However, total losses, $E_{total}$, i.e. $E_{rec}+E_{on}$ where $E_{rec}$ is the diode reverse recovery losses remains the same (see table below).

Figure 15:
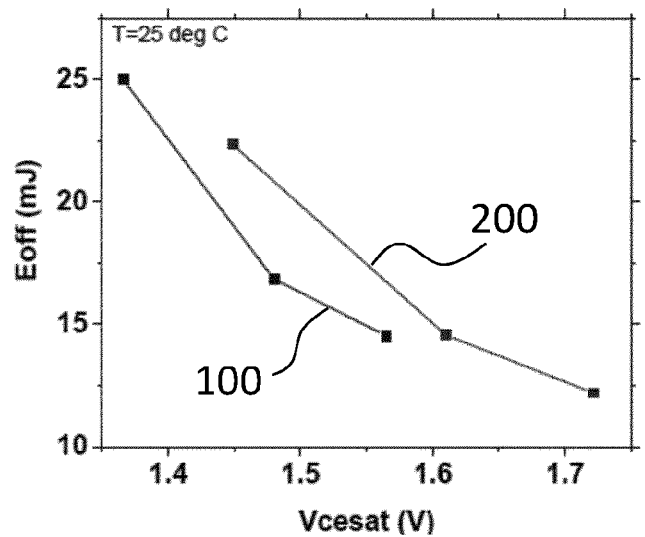

FIG. 15 shows the simulated technology curve ($E_{off}$ VS $V_{ce\text{-}sat}$) at 25° C. for the IGBT according to FIG. 5 (curve 100) compared to the reference IGBT according to FIG. 6 (curve 200). The IGBT according to FIG. 5 has a superior technology curve as compared to the reference IGBT. For the same $V_{ce\text{-}sat}$, the IGBT according to FIG. 5 shows 18% lower $E_{off}$ as compared to the reference IGBT. While, for the same $E_{off}$, $V_{ce\text{-}sat}$ of the IGBT according to FIG. 5 is 5% lower as compared to that of the reference IGBT.

The following table shows a summary of the simulation results of the IGBT according to FIG. 5 (row 100) compared to the reference IGBT according to FIG. 6 (row 200) and compared to an IGBT according to FIG. 6, but without the electrical contact of the main electrode to the semiconductor body in the region between the active trench 4 and the dummy trench 40 (row 300), i.e. without dummy contact.

| IGBT | $V_{ce\text{-}sat}$ | $E_{off}$ | $E_{on}$ | $E_{rec}$ | $E_{tot}$ |
|---|---|---|---|---|---|
| 100 | 1.48 V | 16.85 mJ | 8 mJ | 36.13 mJ | 44.13 mJ |
| 200 | 1.61 V | 14.56 mJ | 12.92 mJ | 31.7 mJ | 44.6 mJ |
| 300 | 1.42 V | 18.94 mJ | | | |

FIG. 16 shows a further exemplary embodiment of the semiconductor device 100 which is similar to the one of FIG. 3. In contrast to the exemplary embodiment of FIG. 3, however, a first enhancement region 16 is arranged between the drift layer 11 and the first base region 12. The first enhancement region 16 is of the first conductivity type, i.e. n-doped, and has a greater doping concentration than the drift layer 11, e.g. a factor of at least 10 greater doping concentration. The enhancement region 16 improves on-state losses or Vce-sat by reducing hole leakage.

FIG. 17 shows an example of an IGBT which is similar to the one of FIG. 16, but in which second enhancement regions 17 being of the second conductivity type, i.e. p-doped, are arranged vertically between the second base regions 13 and the drift layer 11. These enhancement regions 17 result in a reduced electron leakage via the electrical contact of the main electrode 2 to the second contact region 15 and in an improved hole collection during turn off.

Figure 18:
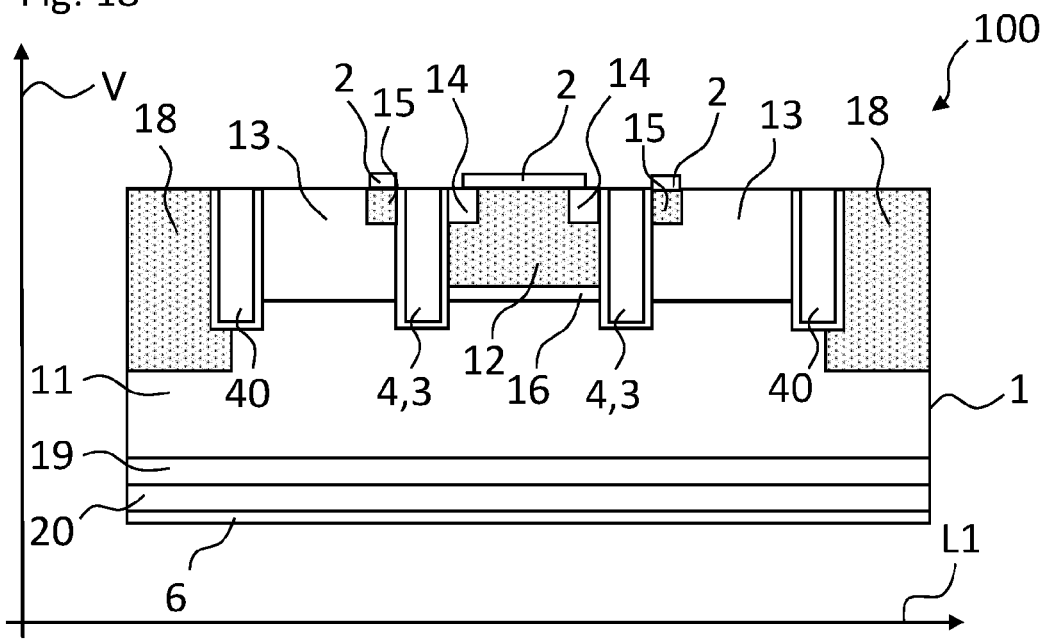

FIG. 18 shows an exemplary embodiment, which is similar to the one of FIG. 4 but which additionally comprises the first enhancement region 16 between the first base region 12 and the drift layer 11.

Figure 19:
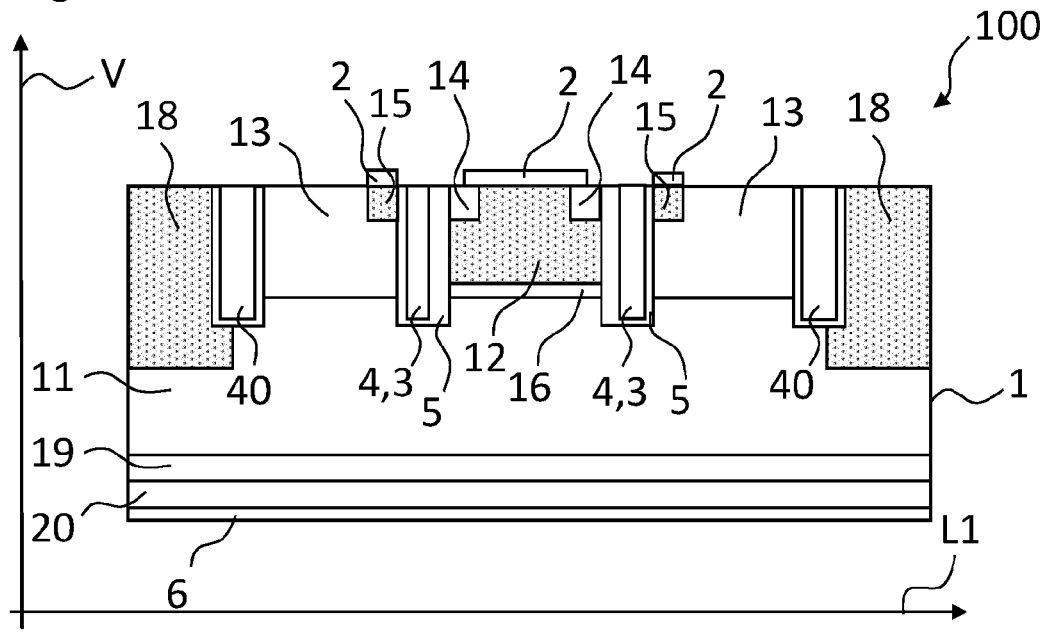

The exemplary embodiment of FIG. 19 is similar to the one of FIG. 18. However, in the active trenches 4, the electrically isolating layer 5 is thicker between the gate electrodes 3 and the first contact regions 14 than between the second contact regions 15 and the gate electrodes 3. This design can reduce Vth of the PMOS transistor allowing it to switch-on early during IGBT off states in order to further reduce the switching losses. In turn, the doping concentration in the second base regions 13 can be increased further to reduce hole leakage via diffusion in the IGBT on-state.

Figure 20:
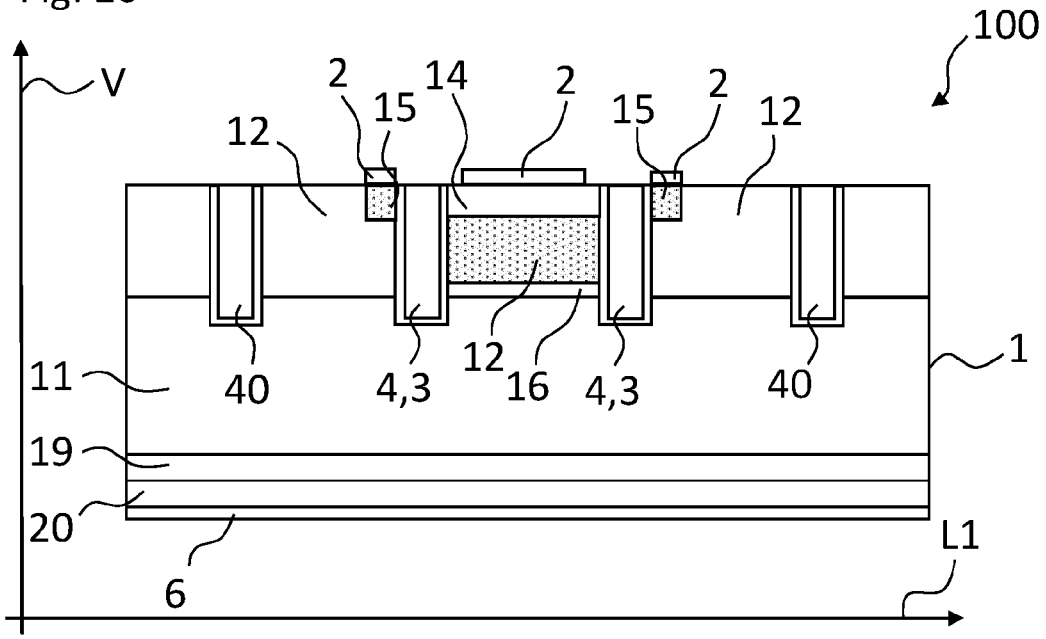

In the exemplary embodiment of FIG. 20, the first contact region 14 extends over the whole lateral extension of the first base region 12 in the first lateral direction L1. In other words, the first contact region 14 extends in the first lateral direction L1 from one active trench 4 to the next active trench 4. In this way, the hole path from the drift layer 11 to the main electrode 2 via the first base region 12 can be completely suppressed.

Figure 21:
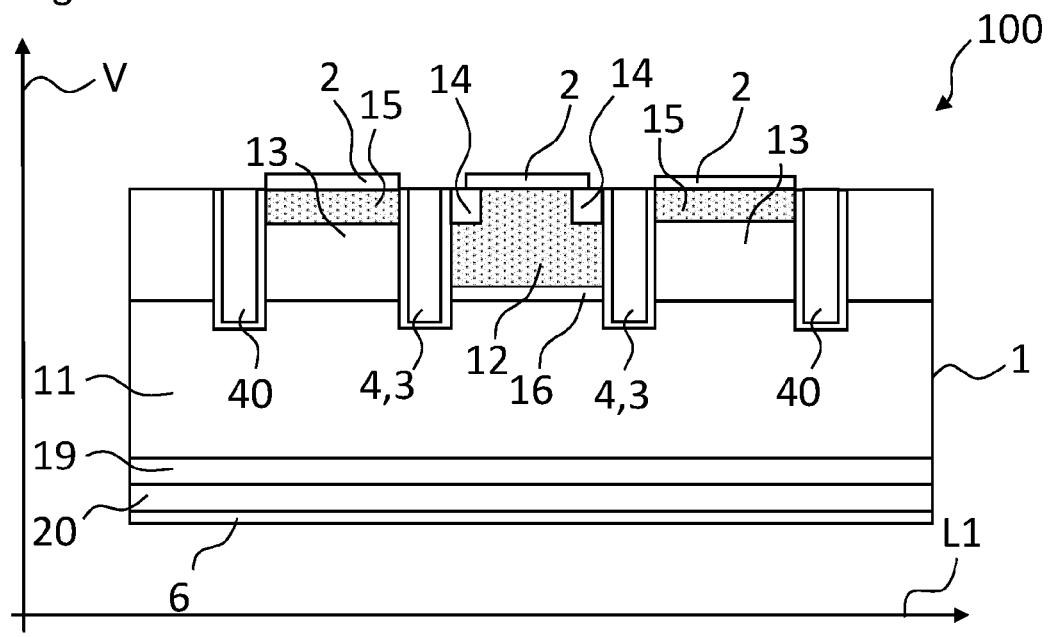

In the exemplary embodiment of FIG. 21, the second contact regions 15 have the same lateral extension in the first lateral direction L1 as the second base regions 13. In other words, the second contact regions 15 extend in the first lateral direction L1 from the respective active trench 4 to the next dummy trench 40.

Figure 22:
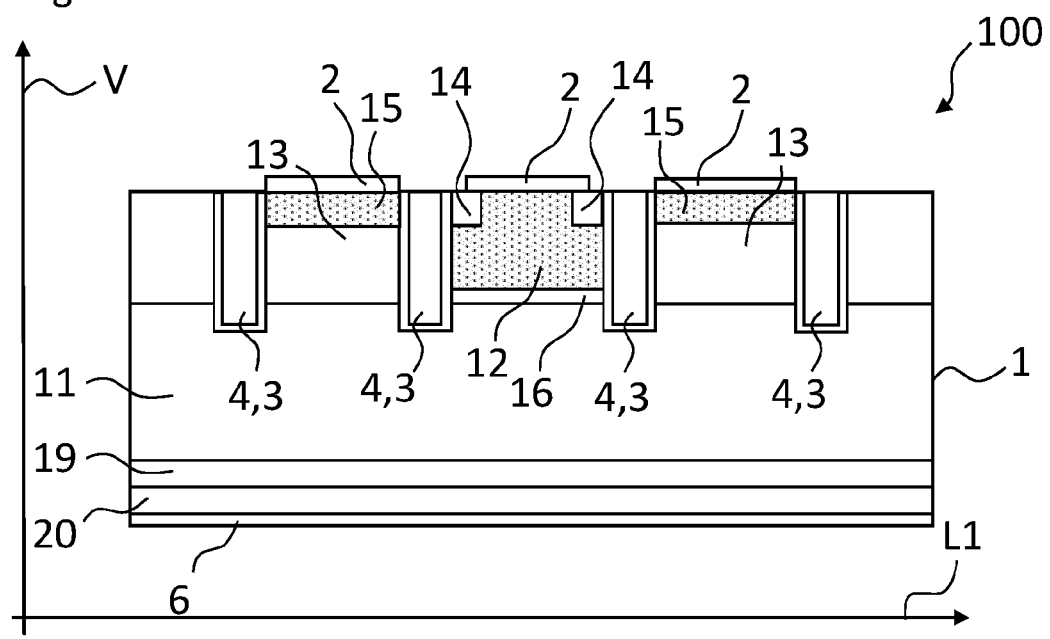

The exemplary embodiment of FIG. 22 is similar to the one of FIG. 21. However, now the trenches on both sides of the second base regions 13 are active trenches 4. In this embodiment, PMOS transistors are formed at both active trenches 4 adjoining the respective second base region 13.

Figure 23:
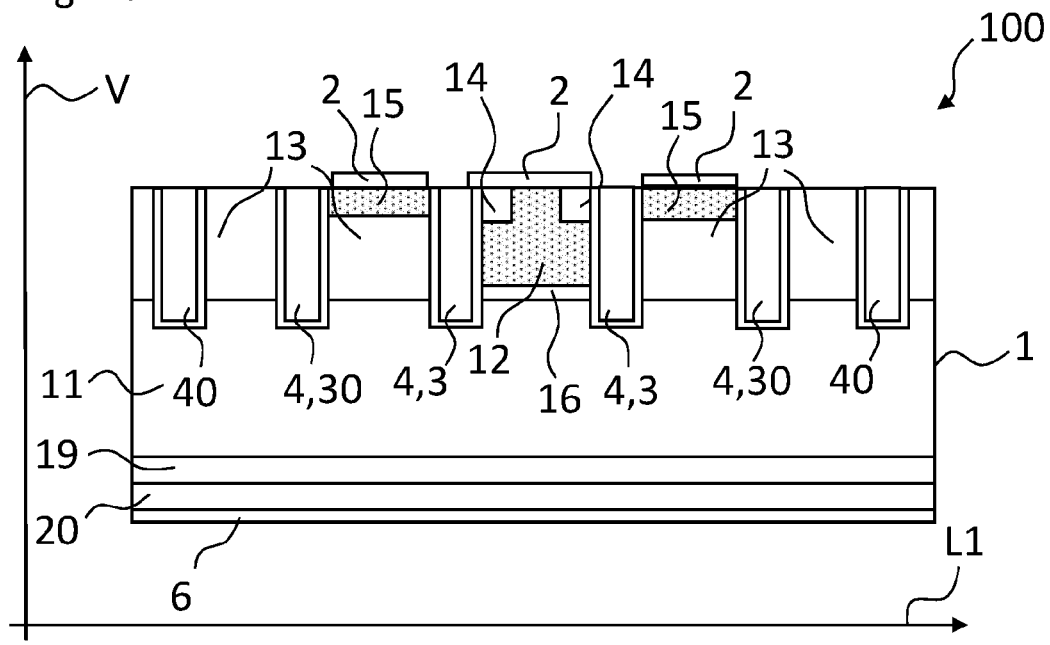

The exemplary embodiment of FIG. 23 shows a similar exemplary embodiment as in FIG. 22, but with additional dummy trenches 40 sandwiching the four active trenches 4 in the first lateral direction L1. Between the dummy trenches 40 and the active trenches 4, further second base regions 13 are formed. With the additional dummy trenches 40, the Miller capacitance Cgc can be further reduced.

Figure 24:
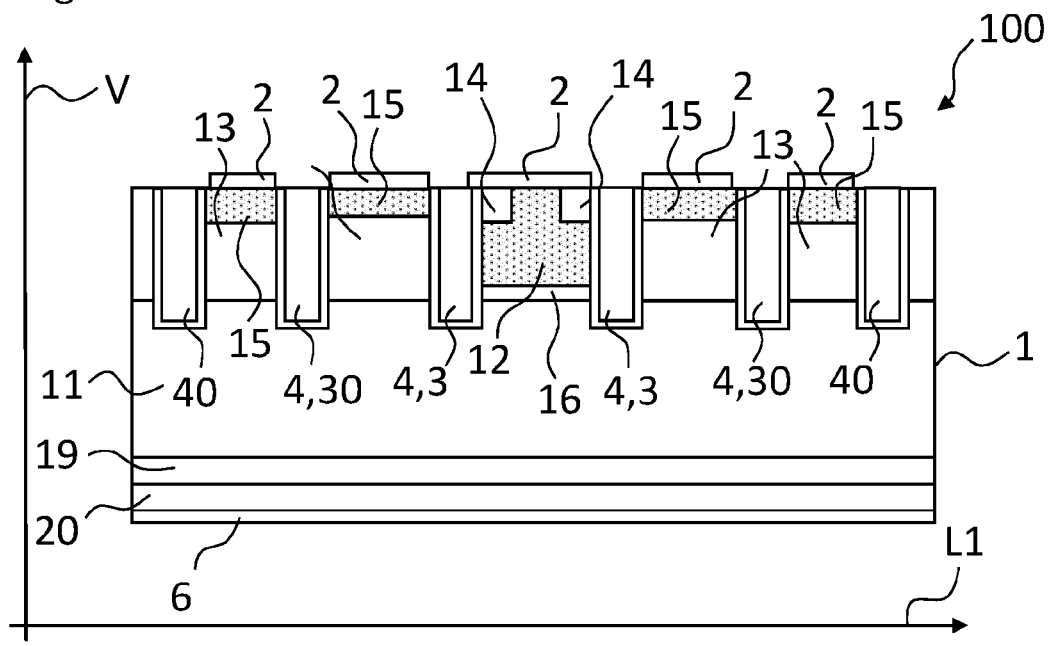

In the exemplary embodiment of FIG. 24, in contrast to FIG. 23, second contact regions 15 are formed in the further second base regions 13. The main electrode 2 may also be in electrical contact with these second contact regions 15.

Figure 25:
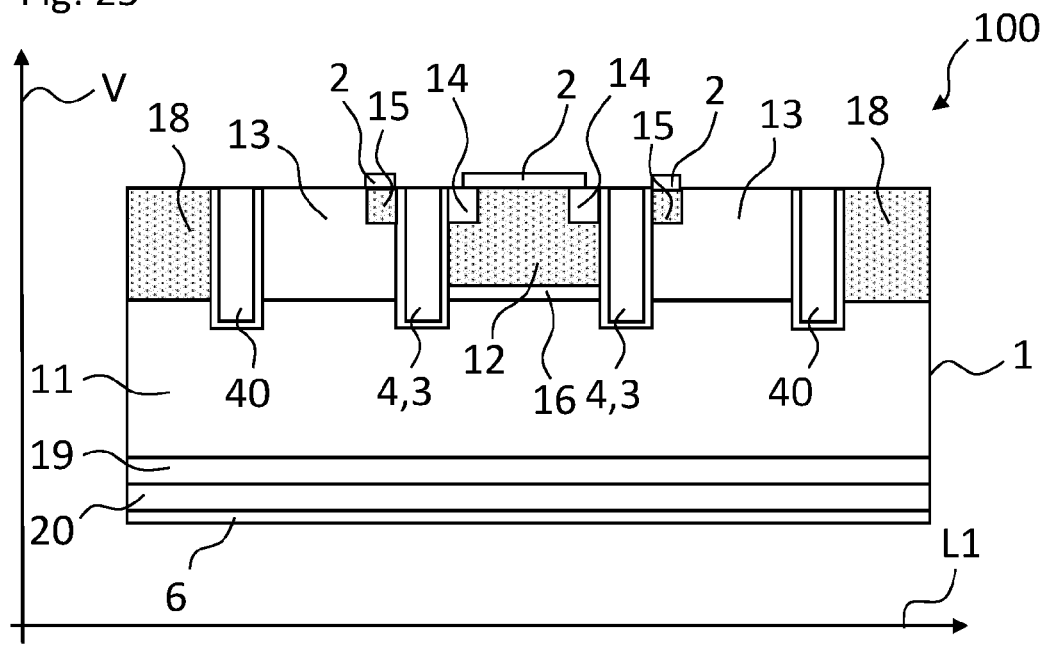

In the exemplary embodiment of FIG. 25, the second base regions 13 are only formed between the active trenches 4 and the dummy trench 40. On the other side of the dummy trenches 40, third base regions 18 being of the second conductivity type are formed. The dummy trenches 40 and the active trenches 4 extend deeper into the semiconductor body 1 than the base regions 12, 13, 18.

Figure 26:
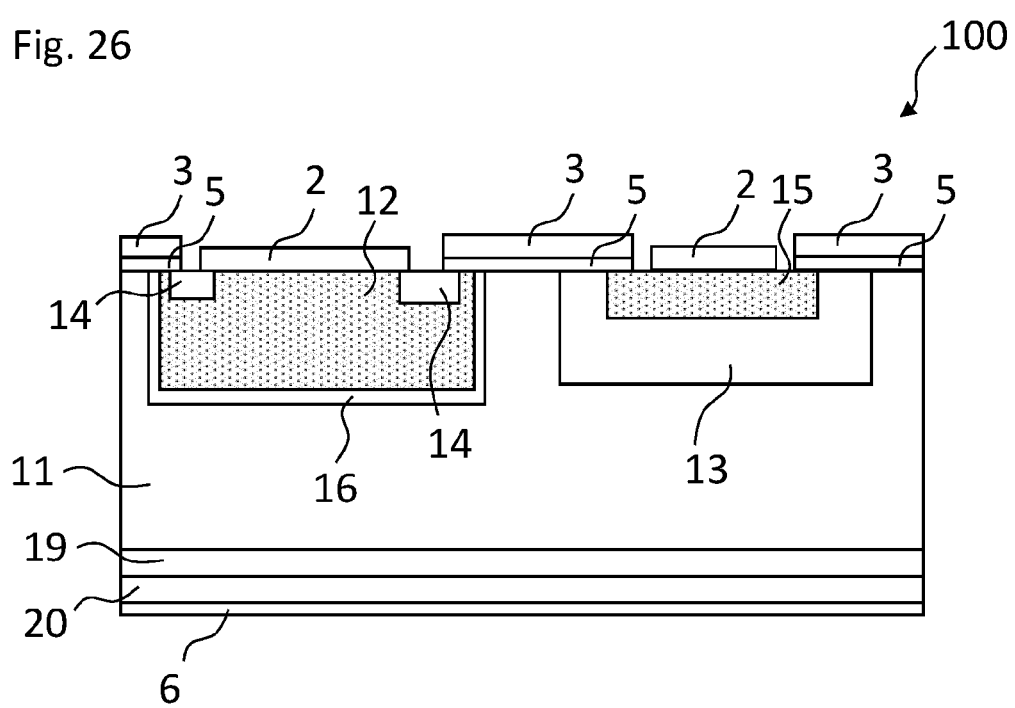

In the exemplary embodiment of FIG. 26, a planar IGBT 100 similar to the one of FIG. 2 is shown. Also here, an enhancement region 16 being of the first conductivity type is arranged between the first base region 12 and the drift layer 11.

Figure 31:
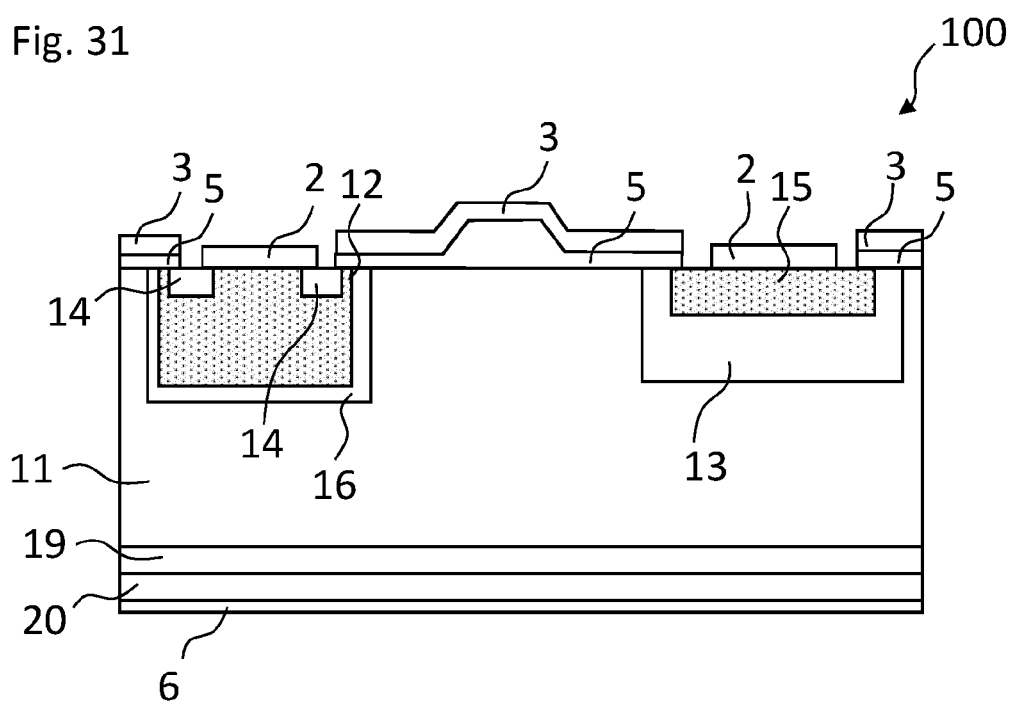

FIG. 31 shows and exemplary embodiment of a planar IGBT 100 with a non-uniform thickness of the electrically isolating layer 5 for reducing the gate capacitance.

Figure 27:
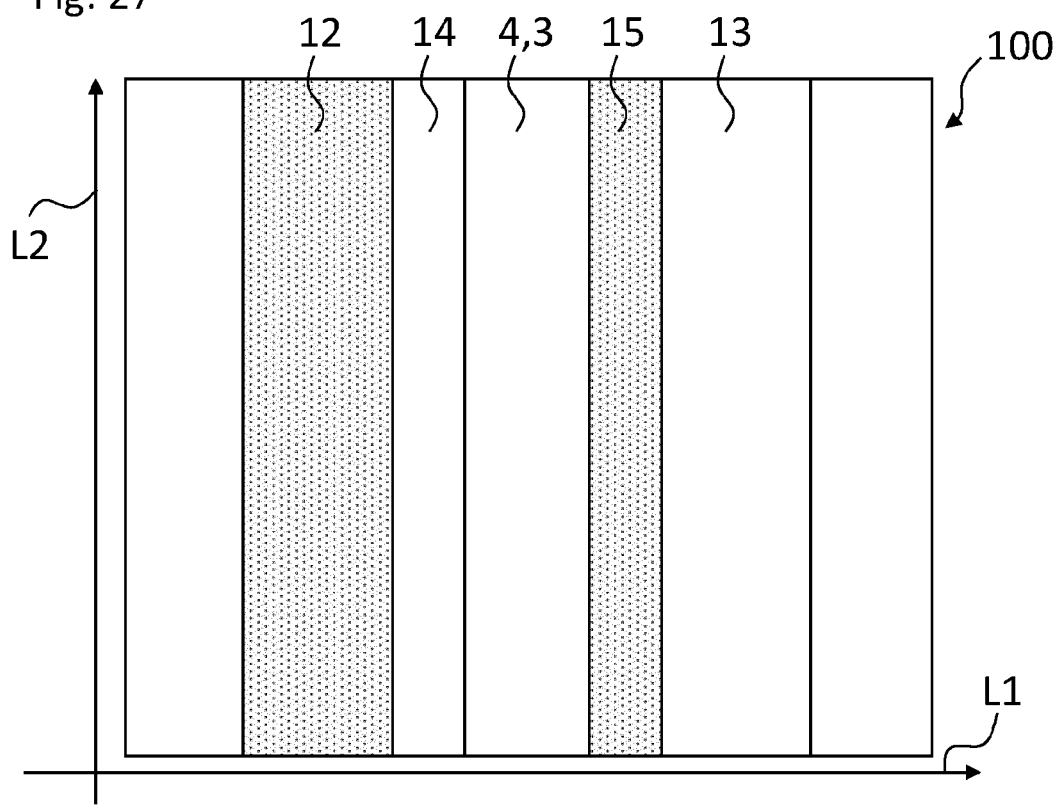

FIG. 27 shows an exemplary embodiment of a semiconductor device 100 in plan view of the top side 10. As can be seen here, the base regions 12, 13 and the contact regions 14, 15 are elongated with main extension directions being, in each case, parallel to a second lateral direction L2 which is perpendicular to the first lateral direction L1.

Figure 28:
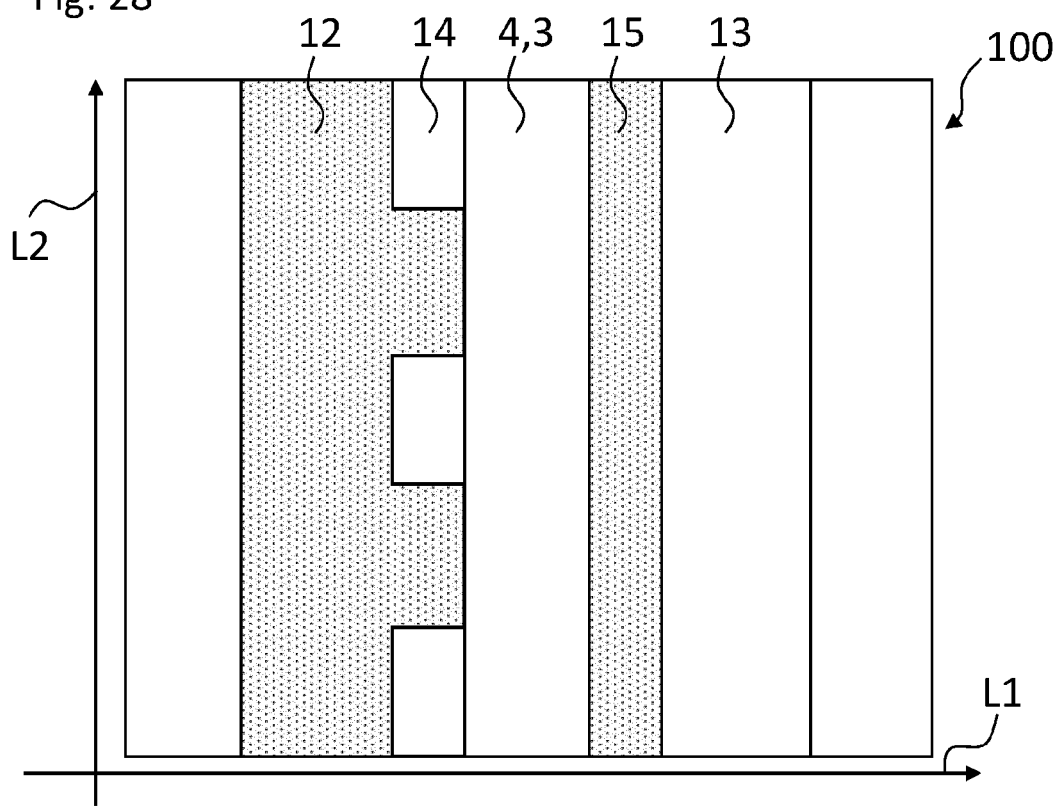

In the exemplary embodiment of FIG. 28, a plurality of first contact regions 14 is embedded in the same first base region 12. These first contact regions 14 are arranged one after the other and spaced from each other in the second lateral direction L2.

In FIG. 29, a plurality of second contact regions 15 is embedded in the second base region 13. The second contact regions 15 are arranged one after the other and spaced from each other in the second lateral direction L2. Differently to what is shown in FIG. 29, the first contact regions 14 do not have to lie exactly opposite to the second contact regions 15 but may be arranged in a staggered configuration.

In contrast to what has been shown in the exemplary embodiments, the thicknesses (depth) of the first base region 12 and the second base region(s) 13 could be different from each other. Also the spacing between the trenches 4, 40 could be different from each other.

FIG. 30 shows a flowchart of an exemplary embodiment of the method for producing a semiconductor device.

In a step S1, a semiconductor body with a top side and a drift layer of a first conductivity type is provided. In further steps S2, S3, S4 and S5, a first base region, a second base region, a first contact region and a second contact region are produced. The first base region is of a second conductivity type and is produced such that the first base region lies vertically between the drift layer and the top side. The second base region is of the first conductivity type and is produced such that the second base region lies vertically between the drift layer and the top side, wherein the second base region has a greater doping concentration than the drift layer and adjoins the drift layer. The first contact region is of the first conductivity type and is produced such that the first contact region adjoins the first base region and the top side. The second contact region is of the second conductivity type and is produced such that the second contact region adjoins the second base region as well as the top side. In a further step S6, a main electrode is applied onto the top side and an electrical contact between the main electrode and the first contact region as well as between the main electrode and the second contact region is established. In a further step S7, a gate electrode is formed so that, in the end, the gate electrode lies between the first contact region and the second contact region as well as between the first base region and the second base region in a first lateral direction.

The embodiments shown in the figures as stated represent exemplary embodiments of the improved semiconductor device and the improved method for producing a semiconductor device; therefore, they do not constitute a complete list of all embodiments according to the improved semiconductor device and improved method. Actual semiconductor devices and methods may vary from the embodiments shown in terms of arrangements and elements for example.

REFERENCE SIGNS 1 semiconductor body
2 main electrode
3 gate electrode 4 active trench
5 electrically isolating material
6 further main electrode
10 top side
11 drift layer
12 first base region
13 second base region
14 first contact region
15 second contact region
16 first enhancement region
17 second enhancement region
18 third base region
19 layer
20 layer
40 dummy trench
100 semiconductor device
200 reference semiconductor device
Si method step
L1 first lateral direction
L2 second lateral direction
V vertical direction
100_i label for curves
200_i label for curves

The invention claimed is:

1. A bipolar semiconductor device, comprising:
a semiconductor body with a top side and a back side,
a main electrode on the top side,
a further main electrode on the back side, and
a gate electrode, wherein
the semiconductor body comprises
    a drift layer of a first conductivity type,
    a first base region of a second conductivity type arranged vertically between the drift layer and the top side,
    a second base region of the first conductivity type arranged vertically between the drift layer and the top side, the second base region having a greater doping concentration than the drift layer and adjoining the drift layer,
    a first contact region of the first conductivity type, the first contact region adjoining the first base region and the top side,
    a second contact region of the second conductivity type, the second contact region adjoining the second base region and the top side,
the main electrode is in electrical contact with the first contact region and the second contact region,
in a first lateral direction, at least a portion of the gate electrode is arranged between the first contact region and the second contact region as well as between the first base region and the second base region,
a thickness of an insulating material between the first contact region and/or the first base region and the gate electrode is greater than a thickness of an insulating material between the second contact region and/or the second base region and the gate electrode.

2. The bipolar semiconductor device according to claim 1, wherein
the semiconductor device is configured such that, by setting the electrical potential of the gate electrode,
either a zone of the first base region is inverted by means of the gate electrode and a current flow of first-type charge carriers between the drift layer and the first contact region through this zone is enabled, or
a zone of the second base region is inverted by means of the gate electrode and a current flow of second-type charge carriers between the drift layer and the second contact region through this zone is enabled.

3. The bipolar semiconductor device according to claim 1, wherein
the semiconductor device is a planar device with the gate electrode arranged on the top side.

4. The bipolar semiconductor device according to claim 1, wherein
the semiconductor device is a trench device with the gate electrode being arranged in an active trench extending from the top side in a vertical direction into the semiconductor body.

5. The bipolar semiconductor device according to claim 4, further comprising
at least one dummy trench arranged next to the active trench and spaced from the active trench in the first lateral direction, wherein
the dummy trench is filled with an electrically conductive material which is electrically connected to the main electrode.

6. The bipolar semiconductor device according to claim 1, wherein
an enhancement region of the first conductivity type is arranged vertically between the first base region and the drift layer,
the enhancement region has a greater doping concentration than the drift layer.

7. The bipolar semiconductor device according to claim 1, wherein
a third base region being of the second conductivity type is arranged next to the second base region in the first lateral direction so that the second base region is arranged between the first and the third base region in the first lateral direction.

8. The bipolar semiconductor device according to claim 7, wherein
the semiconductor device is a trench device with the gate electrode being arranged in an active trench extending from the top side in a vertical direction into the semiconductor body,
the third base region extends from the top side into the semiconductor body and deeper into the semiconductor body than the active trench.

9. The bipolar semiconductor device according to claim 1, wherein the main electrode is not in direct electrical contact with the second base region.

10. The bipolar semiconductor device according to claim 2, further comprising
a further gate electrode spaced from the gate electrode in the first lateral direction, wherein
the second base region is arranged between the gate electrode and the further gate electrode in the first lateral direction,
the semiconductor device is configured such that, by setting the electrical potential of the further gate electrode, a zone of the second base region is inverted by means of the further gate electrode, said zone being located at a side of the second base region opposite to the side of the second base region at which the zone of the second base region is inverted by means of the gate electrode and thereby provides a current path at this opposite side.

11. The bipolar semiconductor device according to claim 1, wherein
the first and/or the second contact regions are elongated regions extending in a second lateral direction being oblique to the first lateral direction.

12. The bipolar semiconductor device according to claim 1, further comprising several first contact regions adjoining the top side and the first base region and being in electrical contact with the main electrode, wherein the first contact regions are separated and spaced from each other in a second lateral direction being oblique to the first lateral direction and/or several second contact regions adjoining the top side and the second base region and being in electrical contact with the main electrode, wherein the second contact regions are separated and spaced from each other in a second lateral direction being oblique to the first lateral direction.

13. The bipolar semiconductor device according to claim 1, wherein the semiconductor device is an IGBT.

14. A method for producing a bipolar semiconductor device, comprising:

providing a semiconductor body with a top side, a back side and a drift layer of a first conductivity type, producing a first base region being of a second conductivity type so that the first base region lies vertically between the drift layer and the top side, a second base region being of the first conductivity type so that the second base region lies vertically between the drift layer and the top side, wherein the second base region has a greater doping concentration than the drift layer and adjoins the drift layer, a first contact region being of the first conductivity type so that the first contact region adjoins the first base region and the top side, a second contact region being of the second conductivity type so that the second contact region adjoins the second base region as well as the top side, applying a main electrode onto the top side and establishing an electrical contact between the main electrode and the first contact region as well as between the main electrode and the second contact region, applying a further main electrode onto the back side, forming a gate electrode so that, in the end, at least a portion of the gate electrode lies between the first contact region and the second contact region as well as between the first base region and the second base region in a first lateral direction, a thickness of an insulating material between the first contact region and/or the first base region and the gate electrode is greater than a thickness of an insulating material between the second contact region and/or the second base region and the gate electrode.

* * * * *